US012177590B2

(12) United States Patent
Tashiro

(10) Patent No.: US 12,177,590 B2
(45) Date of Patent: Dec. 24, 2024

(54) PIXEL CIRCUIT CONFIGURED WITH GLOBAL SHUTTER ENSURING SUFFICIENT SATURATED CHARGES

(71) Applicant: SONY SEMICONDUCTOR SOLUTIONS CORPORATION, Kanagawa (JP)

(72) Inventor: Yoshiaki Tashiro, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 130 days.

(21) Appl. No.: 17/776,977

(22) PCT Filed: Dec. 2, 2020

(86) PCT No.: PCT/JP2020/044946
§ 371 (c)(1),
(2) Date: May 13, 2022

(87) PCT Pub. No.: WO2021/112154
PCT Pub. Date: Jun. 10, 2021

(65) Prior Publication Data
US 2022/0394207 A1 Dec. 8, 2022

(30) Foreign Application Priority Data

Dec. 2, 2019 (JP) .................. 2019-218404

(51) Int. Cl.
*H04N 25/771* (2023.01)
*H01L 27/146* (2006.01)
(Continued)

(52) U.S. Cl.
CPC ..... *H04N 25/771* (2023.01); *H01L 27/14603* (2013.01); *H01L 27/14694* (2013.01);
(Continued)

(58) Field of Classification Search
None
See application file for complete search history.

(56) References Cited

U.S. PATENT DOCUMENTS

2002/0190215 A1* 12/2002 Tashiro ................. H04N 5/325
348/E5.088
2008/0156966 A1 7/2008 Hsieh
(Continued)

FOREIGN PATENT DOCUMENTS

EP 2337075 6/2011
JP 2011-130364 6/2011
(Continued)

OTHER PUBLICATIONS

International Search Report prepared by the European Patent Office on Feb. 3, 2021, for International Application No. PCT/JP2020/044946, 3 pgs.
(Continued)

*Primary Examiner* — Paul M Berardesca
(74) *Attorney, Agent, or Firm* — Sheridan Ross PC

(57) ABSTRACT

A light detecting device includes a photoelectric conversion unit configured to generate a photoelectric charge, a first charge holding unit that includes a first capacitive element and holds the photoelectric charge generated by the photoelectric conversion unit, a second charge holding unit configured to hold the photoelectric charge transferred from the first charge holding unit, a first transistor arranged on a wiring connecting the first charge holding unit and the second charge holding unit to transfer the photoelectric charge held in the first charge holding unit to the second charge holding unit, and a second transistor configured to cause a pixel signal of a voltage value corresponding to a charge amount of the photoelectric charge held in the second charge holding unit to appear on a signal line.

19 Claims, 25 Drawing Sheets

(51) Int. Cl.
  *H04N 25/532* (2023.01)
  *H04N 25/621* (2023.01)
  *H04N 25/65* (2023.01)
  *H01L 23/00* (2006.01)
  *H04N 25/79* (2023.01)

(52) U.S. Cl.
  CPC ..... *H01L 27/14696* (2013.01); *H04N 25/532* (2023.01); *H04N 25/623* (2023.01); *H04N 25/65* (2023.01); *H01L 24/05* (2013.01); *H01L 24/06* (2013.01); *H01L 24/08* (2013.01); *H01L 24/16* (2013.01); *H01L 27/14634* (2013.01); *H01L 27/14645* (2013.01); *H01L 2224/05647* (2013.01); *H04N 25/79* (2023.01)

(56) References Cited

U.S. PATENT DOCUMENTS

2009/0141155 A1* 6/2009 Ellis-Monaghan .......................... H04N 25/575 348/308
2009/0256060 A1* 10/2009 Meynants ............ H04N 25/771 250/214 A
2010/0097501 A1* 4/2010 Fowler ................ H04N 25/771 348/241
2011/0149104 A1 6/2011 Mabuchi
2019/0238768 A1* 8/2019 Yamada ................ H04N 25/53
2020/0177831 A1* 6/2020 Sugawa ................ H01L 27/146

FOREIGN PATENT DOCUMENTS

TW 201838403 A 10/2018
WO WO-2014141900 A1 9/2014

OTHER PUBLICATIONS

Written Opinion prepared by the European Patent Office on Feb. 3, 2021, for International Application No. PCT/JP2020/044946, 7 pgs.

* cited by examiner

FIG.7

| | WIRING CAPACITANCE | DIFFUSION CAPACITANCE | ELECTROSTATIC CAPACITANCE | AMP CAPACITANCE | InGaAs CAPACITANCE | Total |
|---|---|---|---|---|---|---|
| FD CAPACITANCE | 2.2E-15 | 3.6E-16 | 2.5E-14 | 4.5E-16 | | 2.8E-14 |
| SN CAPACITANCE | 2.5E-15 | 3.6E-16 | 2.0E-14 | | 3.2E-15 | 2.6E-14 |

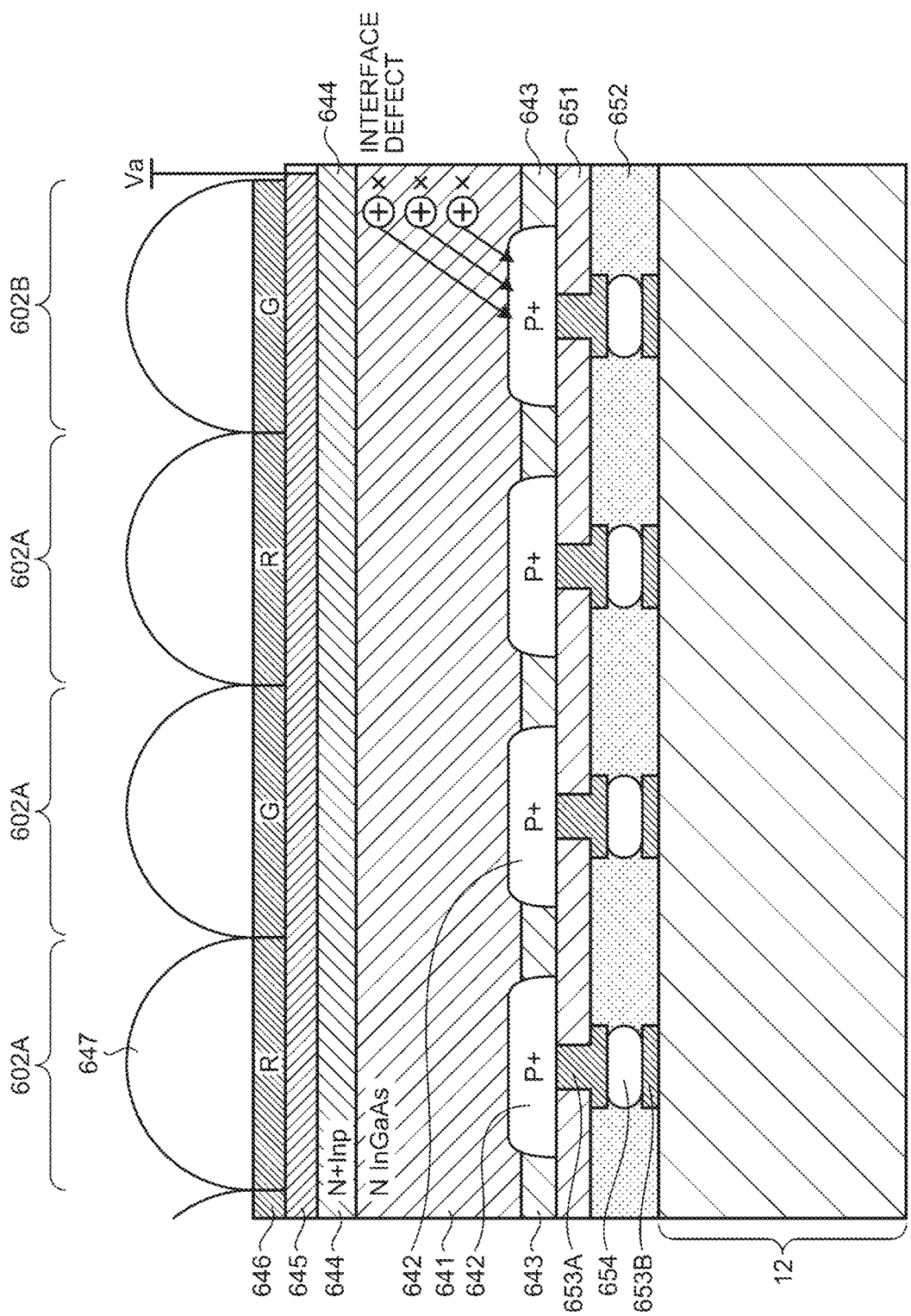

PIXEL CIRCUIT CONFIGURED WITH GLOBAL SHUTTER ENSURING SUFFICIENT SATURATED CHARGES

CROSS REFERENCE TO RELATED APPLICATIONS

This application is a national stage application under 35 U.S.C. 371 and claims the benefit of PCT Application No. PCT/JP2020/044946 having an international filing date of 2 Dec. 2020, which designated the United States, which PCT application claimed the benefit of Japanese Patent Application No. 2019-218404 filed 2 Dec. 2019, the entire disclosures of each of which are incorporated herein by reference.

TECHNICAL FIELD

The present disclosure relates to a solid-state imaging device and an electronic device.

BACKGROUND ART

In recent years, solid-state imaging elements such as a complementary metal oxide semiconductor (CMOS) image sensor (CIS: CMOS Image Sensor) have been remarkably widespread, and are utilized in various fields in place of film-type imaging devices. The solid-state imaging elements are utilized in place of film-type imaging devices in normal imaging of visible light, and are also remarkably utilized in imaging of non-visible light such as ultraviolet rays, infrared rays, X-rays, and gamma rays. Further, in an imaging device having a photoelectric conversion film, a pixel circuit for holding a photoelectric charge by floating diffusion (FD: Floating Diffusion) for performing global shutter driving is known. Such a pixel circuit may be referred to as a pixel circuit of an FD holding type global shutter (GS).

CITATION LIST

Patent Literature

PTL 1: JP 2011-130364 A

SUMMARY OF INVENTION

Technical Problem

However, when the pixel circuit of the FD holding type GS is designed with PN junction capacitance and wiring capacitance, SN capacitance, which is the capacitance of the sense node (SN: Sense Node) serving as a diffusion layer for accumulating the photoelectric charge, has an upper limit of about 10 fF and difficulty in ensuring a sufficient number of saturated charges. If the number of saturated charges of the SN capacitance is not sufficient, the characteristics of the CMOS image sensor may deteriorate.

Therefore, the present disclosure provides a light detecting device, such as a solid-state imaging device, and an electronic device for improving the characteristics of a CMOS image sensor.

Solution to Problem

According to at least some embodiments of the present disclosure, a solid-state imaging device includes: a photoelectric conversion unit configured to generate a photoelectric charge; a first charge holding unit that includes a first capacitive element and holds the photoelectric charge generated by the photoelectric conversion unit; a second charge holding unit configured to hold the photoelectric charge transferred from the first charge holding unit; a first transistor arranged on a wiring connecting the first charge holding unit and the second charge holding unit to transfer the photoelectric charge held in the first charge holding unit to the second charge holding unit; and a second transistor configured to cause a pixel signal of a voltage value corresponding to a charge amount of the photoelectric charge held in the second charge holding unit to appear on a signal line.

According to certain embodiments of the present disclosure, there is provided a light detecting device. The light detecting device includes a photoelectric conversion region configured to generate a photoelectric charge; a sense node, wherein the sense node is connected to the photoelectric conversion region, includes a first capacitive element, and holds the photoelectric charge generated by the photoelectric conversion region; a floating diffusion configured to hold the photoelectric charge transferred from the sense node; a first transistor between the sense node and the floating diffusion, wherein the first transistor is configured to selectively connect the sense node to the floating diffusion to transfer the photoelectric charge held in the sense node to the floating diffusion; and a second transistor between the floating diffusion and a signal line, wherein the second transistor is configured to selectively cause a pixel signal of a voltage value corresponding to a charge amount of the photoelectric charge held in the floating diffusion to appear on the signal line.

In accordance with still further embodiments of the present disclosure, an electronic device is provided. The electronic device includes a pixel array in which a plurality of pixels are arranged in row and column directions; a drive circuit configured to drive pixels to be read out in the plurality of pixels; and a processing circuit configured to read out pixel signals from the pixels to be read out which are driven by the drive circuit. Each of the plurality of pixels includes: a photoelectric conversion region configured to generate a photoelectric charge; a sense node that includes a first capacitive element and that holds the photoelectric charge generated by the photoelectric conversion region; a floating diffusion that includes a second capacitive element and that holds the photoelectric charge transferred from the first charge holding unit; a first transistor arranged between the sense node and the floating diffusion, wherein the first transistor is configured to selectively transfer the photoelectric charge held in the sense node to the floating diffusion; and a second transistor between the floating diffusion and a signal line, wherein the second transistor is configured to selectively cause a pixel signal of a voltage value corresponding to a charge amount of the photoelectric charge held in the second charge holding unit to appear on the signal line.

BRIEF DESCRIPTION OF DRAWINGS

FIG. 7 is a diagram illustrating a design example of the FD and the SN.

FIG. 19 is a diagram illustrating a cross-sectional configuration of another light receiving element.

DESCRIPTION OF EMBODIMENTS

Embodiments of the present disclosure will be described below in detail with reference to the drawings. In each of the following embodiments, the same portions are denoted by the same reference signs, and a repetitive description thereof will be omitted.

Figure 1:
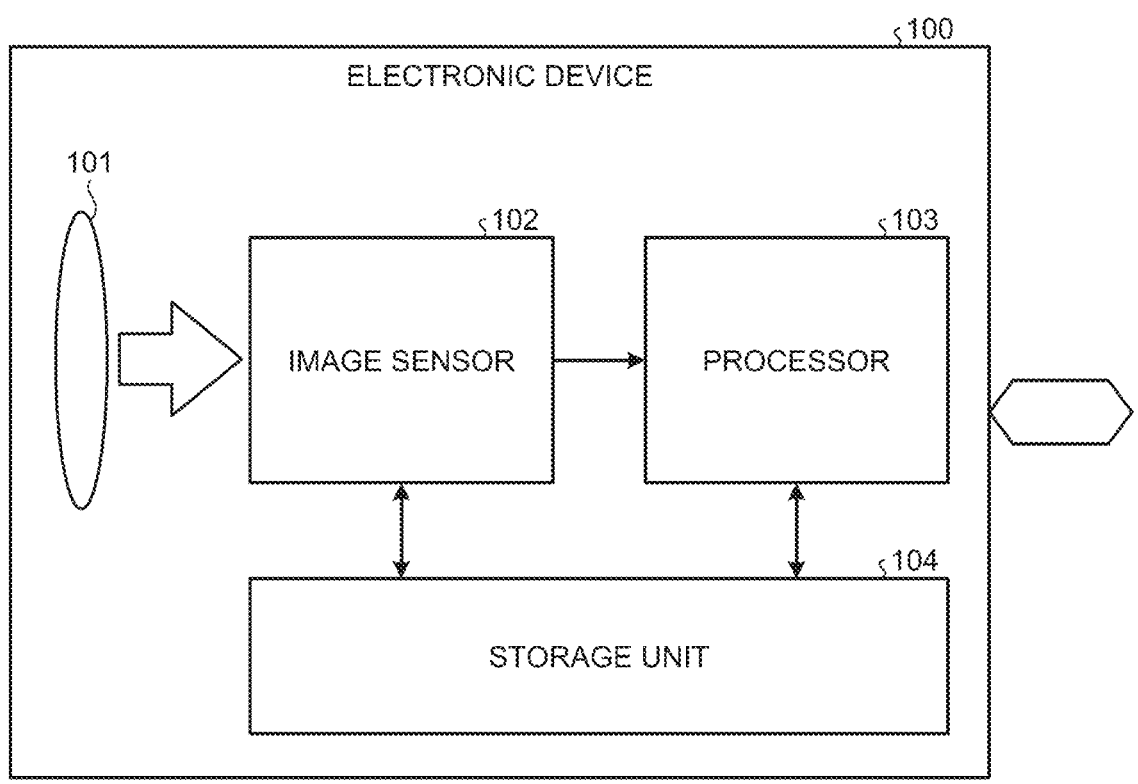
FIG. 1 is a block diagram illustrating a schematic configuration example of an electronic device according to an embodiment of the present disclosure.

Note that the description will be given in the following order.
1. Embodiment
2. Application Examples
3. Application to Mobile Body
4. Application to Endoscopic Surgery System
1. Embodiment
Configuration of Electronic Device FIG. 1 is a block diagram illustrating a schematic configuration example of an electronic device according to an embodiment of the present disclosure. As illustrated in FIG. 1, the electronic device 100 includes, for example, an imaging lens 101, an image sensor 102, a processor 103, and a storage unit 104.

The imaging lens 101 is an example of an optical system that condenses incident light to form an image on the light receiving surface of the image sensor 102. The light receiving surface may be a surface on which photoelectric conversion elements in the image sensor 102 are arranged. The image sensor 102 photoelectrically converts incident light to generate image data. The image sensor 102 also performs predetermined signal processing such as noise removal and white balance adjustment on the generated image data.

The storage unit 104 includes, for example, a flash memory, a dynamic random access memory (DRAM), and a static random access memory (SRAM), and records image data such as those inputted from the image sensor 102.

The processor 103 is configured by using, for example, a central processing unit (CPU), and may include, for instance, an application processor for executing an operating system and various application software, a graphics processing unit (GPU), and a baseband processor. The processor 103 executes various processes as required for image data such as those inputted from the image sensor 102 and those read out from the storage unit 104, displays the image data to the user, and transmits the image data to the outside through a predetermined network, for example.

Configuration of Image Sensor

Figure 2:
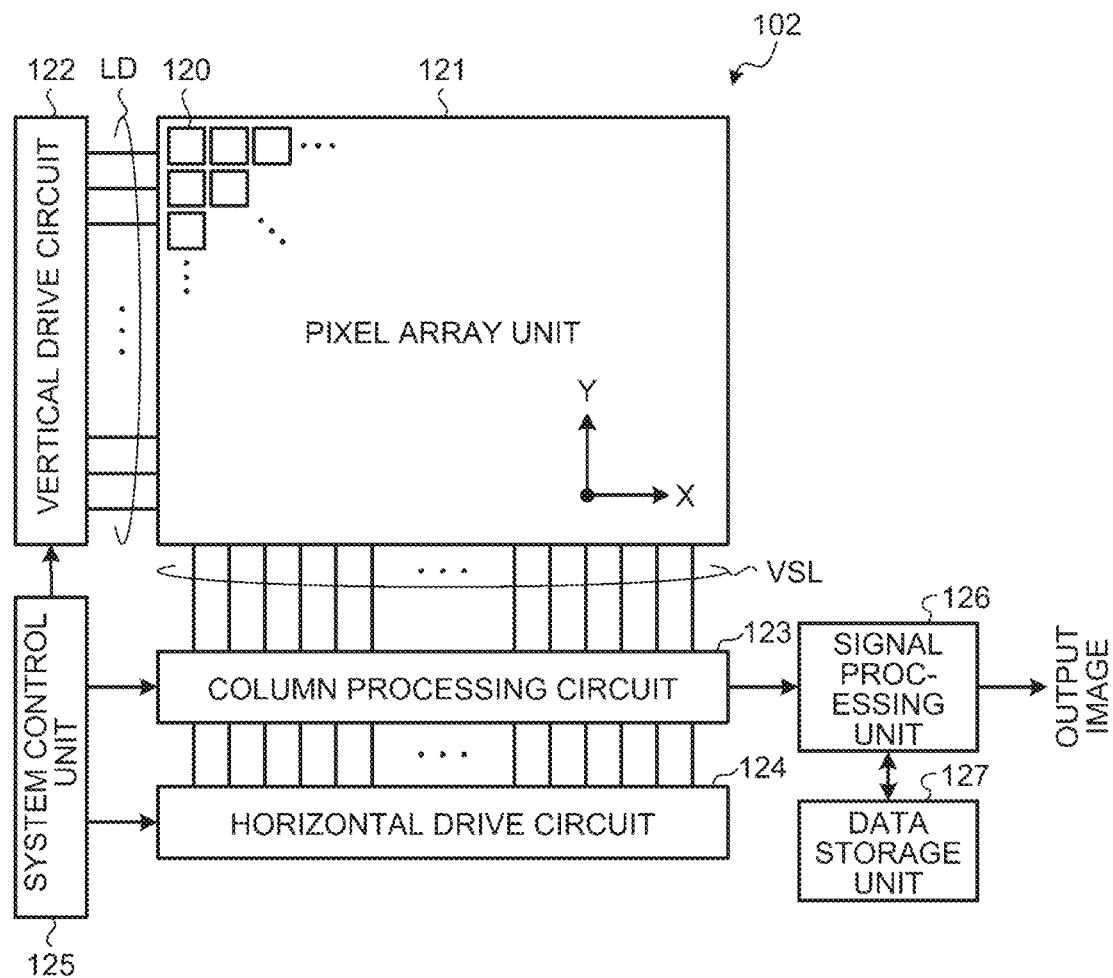
FIG. 2 is a block diagram illustrating a schematic configuration example of an image sensor according to an embodiment of the present disclosure.

FIG. 2 is a block diagram illustrating a schematic configuration example of an image sensor according to an embodiment of the present disclosure. The image sensor 102 is a CMOS-type image sensor. Here, the CMOS-type image sensor is an image sensor produced by applying or partially using a CMOS process. For example, the image sensor 102 is formed of a back-illuminated type image sensor. The image sensor 102 is an example of a "solid-state imaging device".

The image sensor 102 according to the present embodiment has, for example, a stack structure in which a semiconductor chip on which a pixel array unit 121 is formed and a semiconductor chip on which a peripheral circuit is formed are stacked. The peripheral circuit includes, for example, a vertical drive circuit 122, a column processing circuit 123, a horizontal drive circuit 124, and a system control unit 125.

The image sensor 102 further includes a signal processing unit 126 and a data storage unit 127. The signal processing unit 126 and the data storage unit 127 may be provided on the same semiconductor chip as the peripheral circuit or on another semiconductor chip.

The pixel array unit 121 has a configuration in which unit pixels (hereinafter, sometimes simply referred to as "pixels") 120 each having a photoelectric conversion element for generating and accumulating charges according to the amount of received light are arranged in a two-dimensional lattice shape in the row and column directions, that is, in a matrix. The row direction refers to the arrangement direction (horizontal direction in the drawing) of the pixels of the pixel row, and the column direction refers to the arrangement direction (vertical direction in the drawing) of the pixels of the pixel column. The detailed circuit configuration and pixel structure of the pixel 120 will be described below.

In the pixel array unit 121, a pixel drive line LD is wired along the row direction for each pixel row and a vertical signal line VSL is wired along the column direction for each pixel column with respect to a matrix pixel array. The pixel drive line LD transmits a drive signal for driving when a signal is read out from a pixel. In FIG. 2, the pixel drive lines LD are illustrated as one wiring, but not limited to one. One end of the pixel drive line LD is connected to an output terminal corresponding to each row of the vertical drive circuit 122.

The vertical drive circuit 122 is constituted by, for example, a shift register and an address decoder, and drives each pixel 120 of the pixel array unit 121 simultaneously with all pixels or in a row unit, for example. In other words, the vertical drive circuit 122 constitutes a drive unit for controlling the operation of each pixel 120 of the pixel array unit 121 together with the system control unit 125 for controlling the vertical drive circuit 122. Although a specific configuration of the vertical drive circuit 122 is not illustrated, the vertical drive circuit generally includes two scanning systems, a readout scanning system and a sweep scanning system.

The readout scanning system selectively scans the pixel 120 of the pixel array unit 121 sequentially in units of rows, in order to read out a signal from the pixel 120. The signal read out from the pixel 120 is an analog signal. The sweep scanning system performs a sweep scan for a readout row in which a readout scan is performed by the readout scanning system, prior to the readout scan only by an exposure time.

Unnecessary charges are swept out from the photoelectric conversion elements of the pixels 120 in the readout row by the sweep scanning by the sweep scanning system, thereby resetting the photoelectric conversion elements. Then, a so-called electronic shutter operation is performed by sweeping out (resetting) unnecessary charges in the sweep scanning system. Here, the electronic shutter operation refers to an operation of discarding the charge of the photoelectric conversion element and starting a new exposure (initiating the accumulation of charge).

The signal read out by the readout operation by the readout scanning system corresponds to the amount of light received immediately before the readout operation or after the electronic shutter operation. The period from the readout timing by the immediately preceding readout operation or the sweep timing by the electronic shutter operation to the readout timing by the current readout operation is the charge accumulation period (also known as exposure period) in the pixel 120.

A signal outputted from each pixel 120 of the pixel row selectively scanned by the vertical drive circuit 122 is inputted to the column processing circuit 123 through each vertical signal line VSL for each pixel column. The column processing circuit 123 performs predetermined signal processing on a signal outputted from each pixel 120 of the selected row through the vertical signal line VSL for each pixel column of the pixel array unit 121, and temporarily holds the pixel signal after signal processing.

Specifically, the column processing circuit 123 performs at least noise removal processing, for example, correlated double sampling (CDS) processing or double data sampling (DDS) processing as signal processing. For example, the CDS processing removes fixed pattern noise inherent to a pixel such as reset noise and threshold value variation of an amplifier transistor in the pixel 120. The column processing circuit 123 also has an analog-to-digital (AD) conversion function, for example, and converts an analog pixel signal read out from the photoelectric conversion element into a digital signal and outputs the digital signal.

The horizontal drive circuit 124 is constituted by a shift register and an address decoder, for example, and sequentially selects readout circuits (hereinafter referred to as a pixel circuit) corresponding to pixel columns of the column processing circuit 123. The selective scanning by the horizontal drive circuit 124 allows the pixel signals subjected to signal processing by the column processing circuit 123 for each pixel circuit to be sequentially outputted.

The system control unit 125 is constituted by a timing generator for generating various timing signals, for example, and performs drive control of the vertical drive circuit 122, the column processing circuit 123, and the horizontal drive circuit 124, for example, based on the various timings generated by the timing generator.

The signal processing unit 126 has at least an arithmetic processing function, and performs various signal processing such as arithmetic processing on the pixel signals outputted from the column processing circuit 123. The data storage unit 127 temporarily stores data necessary for signal processing in the signal processing unit 126.

Note that the image data outputted from the signal processing unit 126 may be subjected to a predetermined process by the processor 103 in the electronic device 100 on which the image sensor 102 is mounted, or may be transmitted to the outside via a predetermined network, for example.

Figure 3:
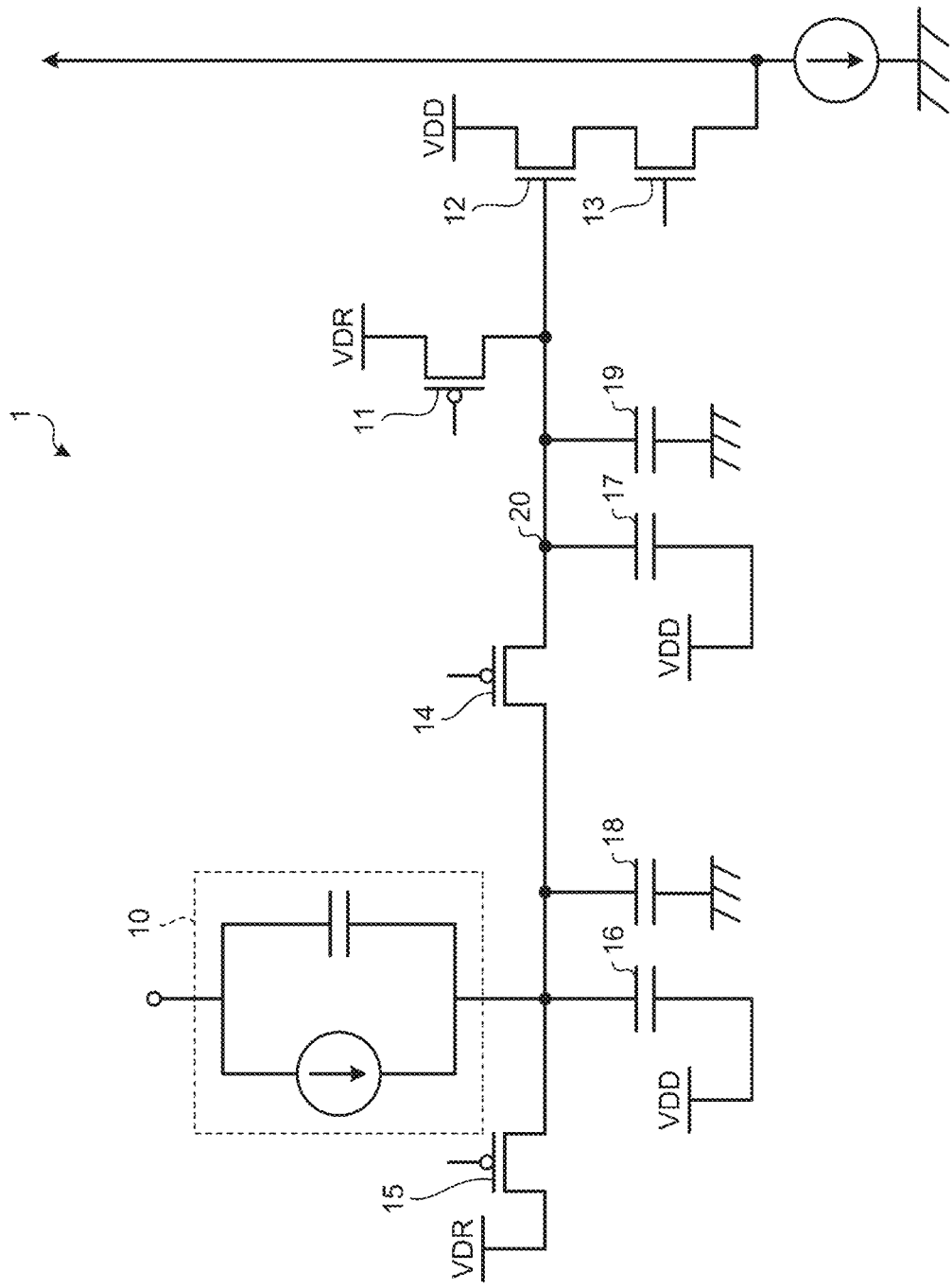
FIG. 3 is a circuit diagram of a pixel circuit according to an embodiment of the present disclosure.

Configuration of Pixel Circuit according to Embodiment of Present Disclosure FIG. 3 is a circuit diagram of a pixel circuit according to an embodiment of the present disclosure. The pixel 120 has a pixel circuit 1 illustrated in FIG. 3. The pixel 120 having the pixel circuit 1 is an example of a "solid-state imaging device".

The pixel circuit 1 includes a photoelectric conversion film (also referred to as a photoelectric conversion unit) 10, a reset (RST: Reset) transistor 11, an amplifier (AMP: Amplifier) transistor 12, and a select (SEL: Select) transistor 13. The pixel circuit 1 also includes a transfer (TRG: Transfer Gate) transistor 14 and a discharge (OFG: Overflow Gate) transistor 15. The pixel circuit 1 also includes a sense node (SN: Sense Node) 21 serving as a diffusion layer of a source of the transfer transistor 14 and a drain of the discharge transistor 15, and an FD (floating diffusion) 20 serving as a floating diffusion layer. Further, the pixel circuit 1 according to the present embodiment has capacitors 16 and 17. The pixel circuit 1 according to the present embodiment is a pixel circuit of an FD holding type global shutter (GS).

The photoelectric conversion film 10 according to the present embodiment is a photoelectric conversion film in which holes formed using a compound semiconductor such as InGaAs are used as carriers for photoelectric conversion. The photoelectric conversion film 10 may also be formed using, for example, a compound semiconductor such as indium arsenide antimonide (InAsSb), indium arsenide (InAs), indium antimonide (InSb), mercury cadmium tellurium (HgCdTe) or germanium (Ge), a quantum (Q) dot, or an organic compound.

The output terminal of the photoelectric conversion film 10 according to the present embodiment is connected to the SN 21 connected to a source of the discharge transistor 15, the source of the transfer transistor 14, and the capacitor 16. The discharge transistor 15 has a source connected to the SN 21 and a drain connected to a low voltage source VDR. The transfer transistor 14 has a source connected to the SN 21 and a drain connected to the FD 20. The output terminal of the FD 20 is connected to the source of the reset transistor 11, the gate of the amplifier transistor 12, and the capacitor 17. A drain of the reset transistor 11 is connected to a low voltage source VDR. In addition, a drain of the amplifier transistor 12 is connected to the voltage source VDD. Further, a source of the amplifier transistor 12 is connected to a drain of the select transistor 13. A source of the select transistor 13 is connected to an output signal line. The capacitor 16 is connected to the output terminal of the photoelectric conversion film 10. The capacitor 17 is connected to the FD 20.

As described above, the output terminal of the photoelectric conversion film 10 is connected to the SN 21. The photoelectric conversion film 10 outputs holes, which are photoelectric conversion carriers, from the output terminal. For example, the photoelectric conversion film 10 has a p-type impurity region, and the p-type impurity region is connected to the SN 21.

As described above, the SN 21 is connected to the output terminal of the photoelectric conversion film 10, the source of the discharge transistor 15, and the source of the transfer transistor 14. The SN 21 further includes a capacitor 16 which is a high capacitive element. Any one of a MOS capacitor, a capacitor having a metal insulator metal (MIM) structure in which an insulator is sandwiched by metals, or a capacitor having a three-dimensional MIM structure can be used as the SN 21. The SN 21 is an example of a "first charge holding unit".

The capacitor 16 has one terminal connected to the SN 21 as described above and the other terminal connected to the voltage source VDD. The capacitor 16 accumulates and holds the charge outputted from the photoelectric conversion film 10. In other words, the capacitor 16 increases the total capacitance of the SN 21 to secure a desired amount of saturated charges. The capacitor 16 is an example of a "first capacitive element".

The SN 21 including the capacitor 16 has the sum of the following four pieces of capacitance as total capacitance. Hereinafter, the total capacitance of the SN 21 including the capacitor 16 is simply referred to as "total capacitance of the SN 21". One of the total capacitance of the SN 21 is wiring capacitance of each wiring connected to the photoelectric conversion film 10, the discharge transistor 15, the transfer transistor 14, and the capacitor 16. The other one of the total capacitance of the SN 21 is diffusion capacitance serving as a diffusion layer. The other one of the total capacitance of the SN 21 is the capacitance of the capacitor 16. The other one of the total capacitance of the SN 21 is InGaAs capacitance, which is the capacitance of InGaAs for forming the photoelectric conversion film 10. In FIG. 3, the wiring capacitance, the diffusion capacitance, and the InGaAs capacitance other than the capacitance of the capacitor 16 of the capacitance of the SN 21 are represented as capacitance 18. In other words, the total capacitance of the SN 21 is the capacitance of the capacitor 16 plus the capacitance 18. The SN 21 including the capacitor 16 has capacitance of, for example, 10 fF (femtofarad) or more.

The capacitor 16 has larger capacitance than the other pieces of capacitance that form the total capacitance of the SN 21. For example, the capacitor 16 has capacitance one order of magnitude larger than the other pieces of capacitance that form the total capacitance of the SN 21. In other words, the capacitance of the capacitor 16 becomes the dominant component of the capacitance of the SN 21.

Thus, the addition of the capacitor 16 increases the saturation capacitance of the SN 21. The increase in the number of saturated charges of the SN 21 to a desired value allows noise to be reduced, thereby improving the characteristics of the image sensor 102 including the pixel circuit 1.

The charges held by the SN 21 including the capacitor 16 are discharged to the low voltage source VDR when the discharge transistor 15 is turned on. On the other hand, when the transfer transistor 14 is turned on, the charges held by the SN 21 including the capacitor 16 are transferred to the FD 20.

The discharge transistor 15 is a PMOS. As described above, the discharge transistor 15 has a source connected to the SN 21 and a drain connected to the low voltage source VDR. Further, the gate of the discharge transistor 15 is connected to a discharge control signal line. The discharge transistor 15, which is a PMOS, is turned on when a voltage equal to or lower than a threshold voltage is applied to the gate. In addition, the discharge transistor 15 is turned off when a voltage larger than the threshold voltage is applied to the gate. When the discharge transistor 15 is turned on, the charge held in the photoelectric conversion film 10 and the capacitor 16 is discharged to the low voltage source VDR to reset the photoelectric conversion film 10. The discharge transistor 15 is an example of a "fifth transistor".

The transfer transistor 14 is also a PMOS. As described above, the transfer transistor 14 has a source connected to the output terminal of the photoelectric conversion film 10 and a drain connected to the FD20. Further, the gate of the transfer transistor 14 is connected to the transfer signal line. The transfer transistor 14, which is a PMOS, is turned on when a voltage equal to or lower than a threshold voltage is applied to the gate by the signal sent from the transfer signal line. In addition, the transfer transistor 14 is turned off when a voltage larger than the threshold voltage is applied to the gate. When the transfer transistor 14 is turned on, the charge generated by the photoelectric conversion film 10 and accumulated in the capacitor 16 is transferred to the FD 20. The transfer transistor 14 is an example of a "fourth transistor".

The FD 20 is connected to a drain of the transfer transistor 14, the source of the reset transistor 11, and the gate of the amplifier transistor 12 as described above. The FD 20 further includes a capacitor 17 which is a high capacitive element. Any one of a MOS capacitor, a capacitor having an MIM structure, or a capacitor having a three-dimensional MIM structure can be used as the FD 20. The FD 20 is an example of a "second charge holding unit".

The capacitor 17 has one terminal connected to the FD 20 as described above and the other terminal connected to the voltage source VDD. The capacitor 17 accumulates and holds the charge transferred from the SN 21. In other words, the capacitor 17 increases the total capacitance of the FD 20 to secure a desired amount of saturated charges. The capacitor 17 is an example of a "second capacitive element".

The FD 20 including the capacitor 17 has the sum of the following four pieces of capacitance as total capacitance. Hereinafter, the total capacitance of the FD 20 including the capacitor 17 is simply referred to as "total capacitance of the FD 20". One of the total capacitance of the FD 20 is wiring capacitance of each wiring connected to the reset transistor 11, the amplifier transistor 12, the transfer transistor 14, and the capacitor 17. The other one of the total capacitance of the FD 20 is diffusion capacitance serving as a floating diffusion layer. The other one of the total capacitance of the FD 20 is the capacitance of the capacitor 17. The other one of the total capacitance of the FD 20 is AMP capacitance which is the capacitance of the gate of the amplifier transistor. In FIG. 3, the wiring capacitance, the diffusion capacitance and the AMP capacitance other than the capacitance of the capacitor 17 of the total capacitance of the FD 20 are represented as capacitance 19. In other words, the total capacitance of the FD 20 is the capacitance of the capacitor 17 plus the capacitance 19.

The capacitor 17 has larger capacitance than the other pieces of capacitance forming the total capacitance of the FD 20. For example, the capacitor 17 has capacitance one order of magnitude greater than the other pieces of capacitance that form the total capacitance of FD 20. In other words, the capacitance of the capacitor 17 becomes the dominant component of the capacitance of the FD 20.

The total capacitance of the FD 20 matches the total capacitance of the SN 21. In other words, the pieces of capacitance of the capacitor 16 and the capacitor 17 are determined so that the value obtained by adding the other pieces of capacitance of the SN 21 to the capacitance of the capacitor 16 substantially matches the value obtained by adding the other pieces of capacitance of the FD 20 to the capacitance of the capacitor 17.

The noise of the pixel circuit 1 can be minimized by setting the total capacitance of the FD 20 and the total capacitance of the SN 21 to substantially the same value. However, when the capacitors 16 and 17 are not provided, matching the total pieces of capacitance is difficult due to variations in the manufacturing of the FD 20 and the SN 21. In particular, when the capacitors 16 and 17 are not provided, the dominant component of the total capacitance of the FD 20 is the wiring capacitance, and the dominant component of the total capacitance of the SN 21 is the InGaAs capacitance. Since the wiring capacitance and the InGaAs capacitance have no dependency, there is a possibility that the wiring capacitance and the InGaAs capacitance may swing in the opposite direction such that one becomes larger and the other becomes smaller. In such a case, the difference between the total capacitance of the FD 20 and the total capacitance of the SN 21 becomes large, and the noise may become large.

Therefore, in the pixel circuit 1 according to the present embodiment, the capacitor 17 and the capacitor 16 having capacitance larger than the other pieces of capacitance are arranged in each of the FD 20 and the SN 21. Thus, the capacitance of the capacitor 17 and the capacitance of the capacitor 16 become the dominant components of the total capacitance of the FD 20 and the total capacitance of the SN 21, respectively, so that the influence of manufacturing variations can be reduced, thereby substantially matching the total capacitance of the FD 20 and the total capacitance of the SN 21. Thus, the characteristics of the image sensor 102 including the pixel circuit 1 can be stabilized.

When the transfer transistor 14 is turned on, the FD 20 including the capacitor 17 transfers the charge held by the SN 21 including the capacitor 17, and accumulates and holds the transferred charge. The FD 20 applies a voltage generated by the charge held in the capacitor 17, for example, to the gate of the amplifier transistor 12. The FD 20 turns on the amplifier transistor 12 by applying a voltage equal to or higher than a threshold voltage to the gate of the amplifier transistor 12. When the reset transistor 11 is turned on, the charge held by the FD 20 including the capacitor 17 is discharged to the low voltage source VDR, and the FD 20 is reset.

The reset transistor 11 is a PMOS. As described above, the reset transistor 11 has a source connected to the path connected to the FD 20 and a drain connected to the low voltage source VDR. Further, a gate of the reset transistor 11 is connected to a reset signal line. The reset transistor 11 is turned on when a voltage equal to or lower than the threshold voltage is applied to the gate. In addition, the reset transistor 11 is turned off when a voltage larger than the threshold voltage is applied to the gate. When the reset transistor 11 is turned on, the charge accumulated in the FD 20 is discharged to the low voltage source VDR to reset the FD 20 including the capacitor 17. The reset transistor 11 is an example of a "first transistor".

The amplifier transistor 12 is an N-type MOS transistor (NMOS). As described above, the amplifier transistor 12 has a gate connected to the path connected to the FD 20, a source connected to the voltage source VDD, and a drain connected to the source of the select transistor 13. The amplifier transistor 12 is turned on when a voltage equal to or higher than a threshold voltage is applied to the gate by the charge outputted from the FD 20. In addition, the amplifier transistor 12 is turned off when a voltage smaller than the threshold voltage is applied to the gate. When the amplifier transistor 12 is turned on, the amplifier transistor outputs the current inputted from the voltage source VDD to the select transistor 13. In other words, the amplifier transistor 12 outputs a signal based on the charge held in the FD 20 to the select transistor 13. The amplifier transistor 12 is an example of a "second transistor" and an "image generation unit".

The select transistor 13 is an NMOS. As described above, the select transistor 13 has a source connected to the drain of the amplifier transistor 12 and a drain connected to the output signal line. Further, a gate of the select transistor 13 is connected to a select signal line. Since the select transistor 13 is an NMOS, the select transistor is turned on when a voltage equal to or higher than a threshold voltage is applied to the gate. In addition, the select transistor 13 is turned off when a voltage smaller than the threshold voltage is applied to the gate. When the select transistor 13 is turned on, the select transistor outputs the signal outputted from the amplifier transistor 12 to the output signal line as a pixel signal. In other words, the select transistor 13 controls selection of pixels at the time of reading out by determining whether to output pixel signals from the pixel circuit 1. The select transistor 13 is an example of a "third transistor".

Figure 4:
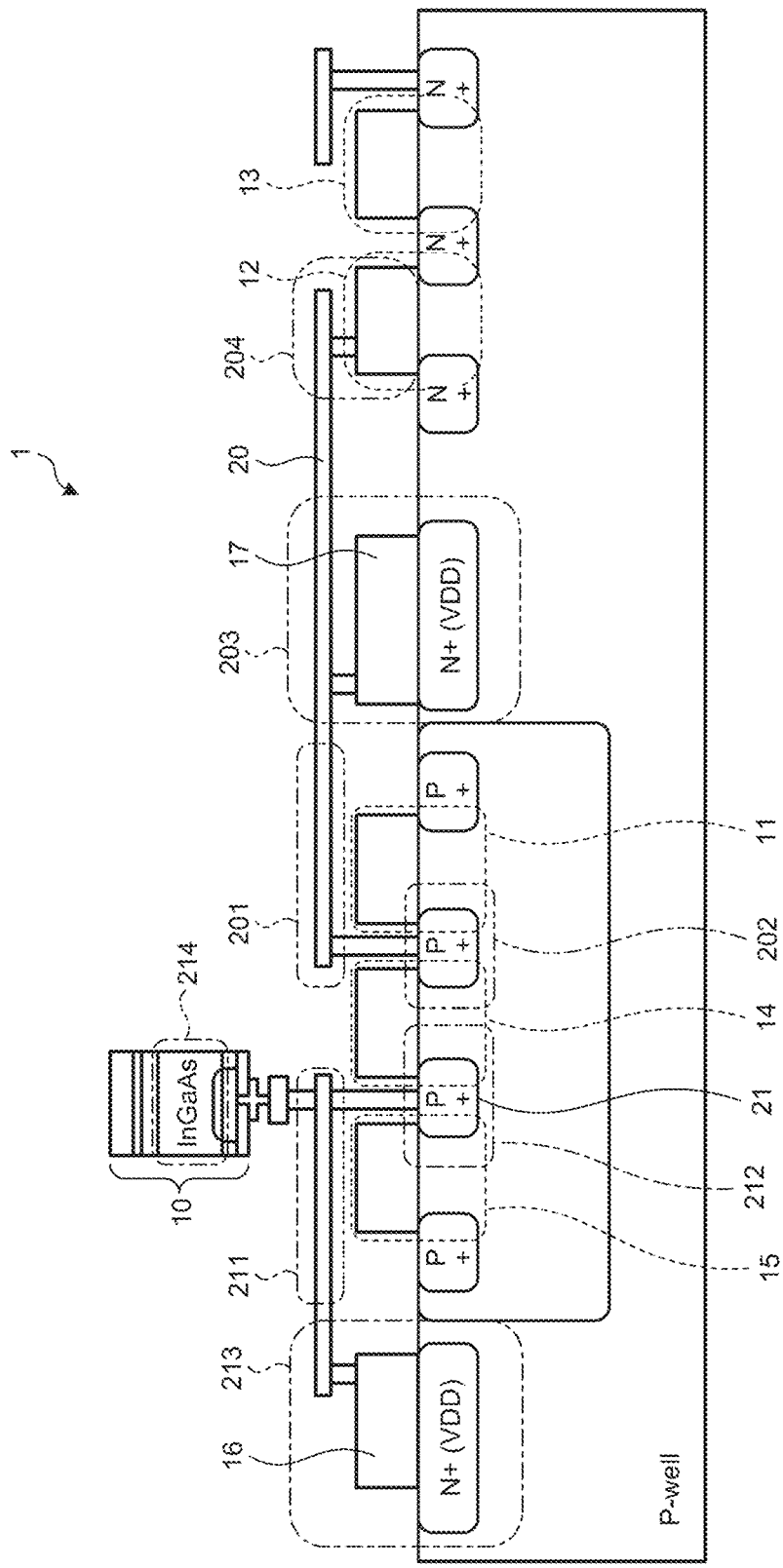
FIG. 4 is a cross-sectional view of the pixel circuit according to an embodiment of the present disclosure.

FIG. 4 is a cross-sectional view of the pixel circuit according to an embodiment of the present disclosure. The total capacitance of the FD 20 and the SN 21 will be collectively described with reference to FIG. 4. As illustrated in FIG. 4, the pixel circuit 1 according to the present embodiment has a P-well arranged on an N-Sub which is an N-type semiconductor substrate, and an N-well arranged in a part of the P-well.

The reset transistor 11, the transfer transistor 14, and the discharge transistor 15 has a source and a drain arranged on the N-well, which are N-type diffusion regions. In other words, the reset transistor 11, the transfer transistor 14, and the discharge transistor 15 share the diffusion layer. In this case, a common N-type diffusion is used for the source of the reset transistor 11 and the drain of the transfer transistor 13. In addition, a common N-type diffusion region is used for the source of the transfer transistor 14 and the source of the discharge transistor 15.

Further, the photoelectric conversion film 10 and the capacitor 16 are connected to a wiring extending from the SN 21. In FIG. 4, the photoelectric conversion film 10 includes, for example, a passivation layer, a transparent electrode layer, an InP (indium phosphide) layer, an InGaAs layer, a Ti—W (titanium-tungsten) layer, and a diffusion layer. Terminals extending from the diffusion layer have electrodes. The diffusion layer and the electrode may be electrically connected via a plurality of wirings. In the wiring extending from the SN 21, electrodes are also arranged via a plurality of wirings. The electrode extending from the diffusion layer of the photoelectric conversion film 10 and the electrode connected to the wiring extending from the SN 21 are directly bonded. The electrode is formed of a metal such as copper or a conductive material.

Further, the amplifier transistor 12 and the select transistor 13 has a source and a drain arranged on the P-well, which are P-type diffusion regions. In other words, the amplifier transistor 12 and the select transistor 13 share the diffusion layer. In this case, a common P-type diffusion region is used for the drain of the amplifier transistor 12 and the source of the select transistor 13.

The FD 20 includes wiring connecting the drain of the transfer transistor 14 and the gate of the amplifier transistor 12. The capacitor 17 is connected to the FD 20.

Further, the respective pieces of capacitance of the FD 20 and the SN 21 will be described. In FIG. 4, the respective pieces of capacitance are indicated by illustrating the approximate positions where the respective pieces of capacitance are held by the portions surrounded by the one-dot chain line and the two-dot chain line.

The total capacitance of the FD 20 includes wiring capacitance 201, diffusion capacitance 202, electrostatic capacitance 203, and AMP capacitance 204. The wiring capacitance 201 is the capacitance of the wiring extending from the FD 20. The diffusion capacitance 202 is the capacitance of the diffusion layer connected to the FD 20. The electrostatic capacitance 203 is the capacitance of the capacitor 17. The AMP capacitance 204 is the capacitance of the gate of the amplifier transistor 12.

The total capacitance of the SN 21 includes wiring capacitance 211, diffusion capacitance 212, electrostatic capacitance 213, and InGaAs capacitance 214. The wiring capacitance 211 is the capacitance of the wiring extending from the SN 21. The diffusion capacitance 212 is the capacitance of the diffusion layer that is the SN 21. The electrostatic capacitance 213 is the capacitance of the capacitor 17. The InGaAs capacitance 214 is the capacitance of the InGaAs layer in the photoelectric conversion film 10.

The electrostatic capacitance 213 is determined such that the number of saturated charges of the SN 21 is a desired value. Further, the electrostatic capacitance 203 is determined so that the values obtained by adding the wiring capacitance 201, the diffusion capacitance 202, the electrostatic capacitance 203, and the AMP capacitance 204 substantially match the values obtained by adding the wiring capacitance 211, the diffusion capacitance 212, the electrostatic capacitance 213, and the InGaAs capacitance 214.

A method of determining the pieces of electrostatic capacitance 203 and 213 will now be described. In the image sensor 102, the number of saturated charges (Qs), the conversion efficiency (C.G. Conversion Gain), and the random noise (RN: Random Noise) of the SN 21 are expressed by the following mathematical formula 1.

[Math. 1]

$$Qs = C_{SN} * (Vtop - VDR) \quad (1)$$
$$C.G. = \frac{q}{C_{SN} + C_{FD}}$$
$$RN[Vrms] = \sqrt{\frac{kT}{C_{FD}}}$$
$$RN[h\text{+rms}] = \sqrt{\frac{kT}{C_{FD}} * (CSN + CF_D)}$$

Where $C_{SN}$ is the total capacitance of the SN 21. $C_{FD}$ is the total capacitance of the FD 20. Vtop is the voltage in the photoelectric conversion film 10. VDR is the voltage of the low voltage source VDR in FIG. 3. Also, q is the amount of charge per electron. In addition, k is a Boltzmann constant. Further, T is a temperature.

Figure 5:
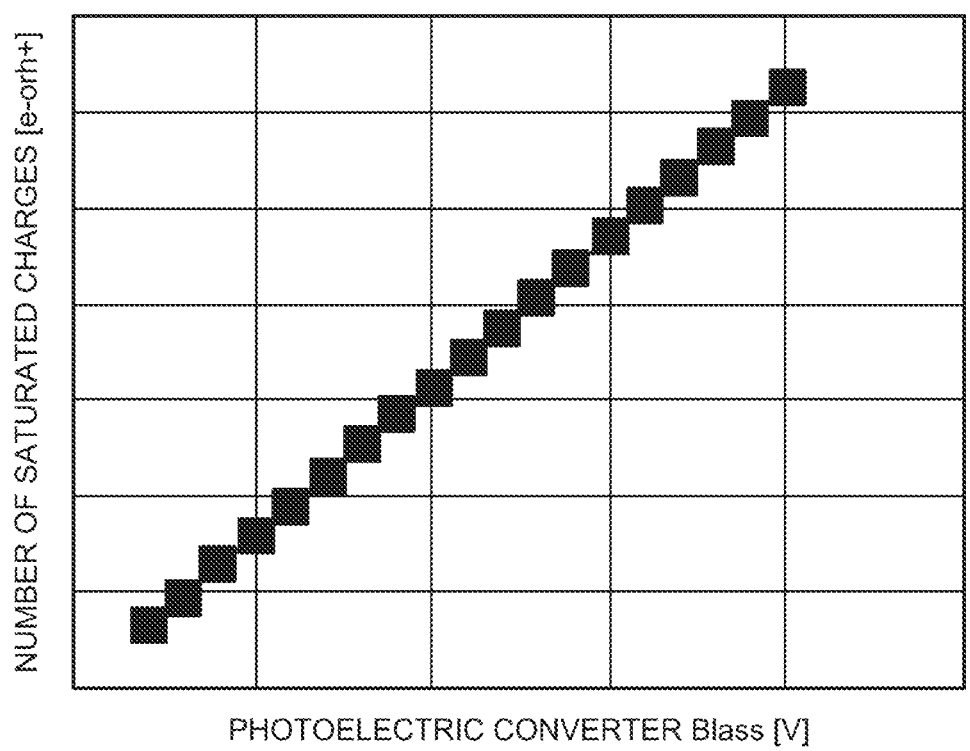
FIG. 5 is a diagram illustrating the relationship between the number of saturated charges and the total capacitance of an SN.

As illustrated in Mathematical Formula 1, the number of saturated charges depends on the $C_{SN}$. FIG. 5 is a diagram illustrating the relationship between the number of saturated charges and the total capacitance of the SN. In a graph of FIG. 5, the vertical axis represents the number of saturated charges and the horizontal axis represents the voltage of the photoelectric conversion film. In other words, as the voltage of the photoelectric conversion film 10 is increased, the number of saturated charges is accumulated. The larger the total capacitance of the SN 21, the greater the amount of saturated charges for each voltage. Therefore, the total capacitance of the SN 21 is determined so as to obtain a desired number of saturated charges. For example, the electrostatic capacitance 203 is determined such that the saturation capacitance of the SN 21 becomes 100,000 when the voltage of the photoelectric conversion film 10 is a predetermined value. The electrostatic capacitance of the capacitor 16 is determined so that the SN 21 has the determined saturation capacitance.

Figure 6:
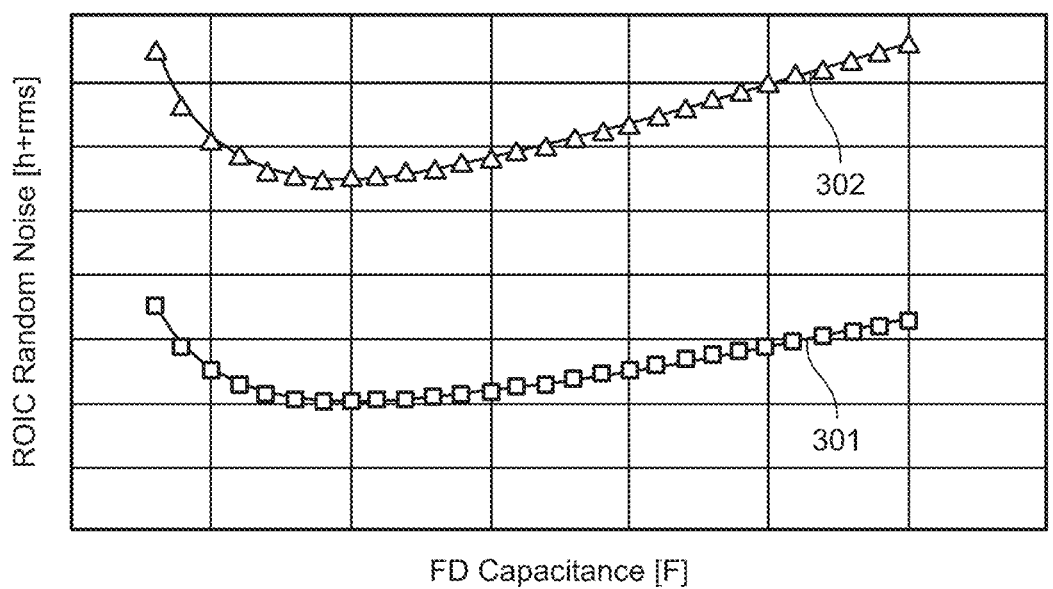
FIG. 6 is a diagram illustrating the relationship between the capacitance of an FD and the random noise.

Further, the relationship between the capacitance of the FD 20 and the random noise is obtained from the mathematical formula expressing the random noise in Mathematical Formula 1 by the number of charges. FIG. 6 is a diagram illustrating the relationship between the capacitance of the FD and the random noise. In a graph of FIG. 6, the vertical axis represents the noise, and the horizontal axis represents the capacitance of the FD 20. Both the kTC noise in the D-phase and the kTC noise in the P-phase are represented by a curve 301. The sum of the noises is then calculated by squaring, adding, and averaging the noises, and the sum of the noises is represented by a curve 302. The random noise is minimized at the minimum point in the curve 302. When the capacitance of the SN 21 and the capacitance of the FD 20 are designed at the same value, the curve 302 becomes minimum. Therefore, the electrostatic capacitance of the capacitor 17 is determined so that the capacitance of the FD 20 matches that of the SN 21.

The total pieces of capacitance of the FD 20 and the SN 21 determined by the method described above is illustrated in FIG. 7. FIG. 7 is a diagram illustrating a design example of the FD and the SN. The values illustrated in FIG. 7 are approximate values. For example, in the SN capacitance which is the total capacitance of the SN 21, the wiring capacitance is 2.5E-15, the diffusion capacitance is 3.6E-16, and the InCaAs capacitance is 3.2E-15. Therefore, in order to obtain a desired saturation amount in this case, the electrostatic capacitance of the capacitor 16 is determined to be 2.0E-14. In this case, the total capacitance of the SN 21 is 2.6E-14.

On the other hand, in the FD capacitance which is the total capacitance of the FD 20, the wiring capacitance is 2.2E-15, the diffusion capacitance is 3.6E-16, and the AMP capacitance is 4.5E-16. Therefore, in order to reduce random noise in this case, the electrostatic capacitance of the capacitor 17 is determined to be 2.5E-14 so that the total capacitance of the FD 20 and the total capacitance of the SN 21 substantially match each other. In this case, the total capacitance of the FD 20 is 2.8E-14, which substantially matches the total capacitance of the SN 21, that is, 2.6E-14. The InGaAs capacitance included in the other pieces of capacitance of the SN 21 other than the capacitor 16 has a relatively large value with respect to the other pieces of capacitance of the FD 20 other than the capacitor 17. Therefore, when the total capacitance of the FD 20 and the total capacitance of the SN 21 are designed to substantially match each other, the capacitance of the capacitor 16 is preferably smaller than the capacitance of the capacitor 17.

Further, as illustrated in FIG. 7, the dominant component of the total capacitance of the FD 20 is the electrostatic capacitance of the capacitor 17, and the dominant component of the total capacitance of the SN 21 is the electrostatic capacitance of the capacitor 16. Since the pieces of electrostatic capacitance of the capacitors 16 and 17 are larger than the other pieces if capacitance included in the total capacitance of the FD 20 and the total capacitance of the SN 21, the influence of the manufacturing variations of the pixel circuit 1 is absorbed by the pieces of electrostatic capacitance of the capacitors 16 and 17, and the total capacitance of the FD 20 and the total capacitance of the SN 21 substantially match each other.

Operation of Pixel Circuit According to Embodiment of Present Disclosure

The flow of pixel signal generation in the pixel circuit 1 of FIG. 3 will now be described. First, the discharge transistor 15 is electrically conductive to reset the photoelectric conversion film 10 and the SN 21 having the capacitor 16. Then, when the discharge transistor 15 is turned off, the charges generated in the photoelectric conversion film 10 are transferred to and accumulated in the SN 21 having the capacitor 16. The operations from the resetting of the photoelectric conversion film 10 to the accumulation of charges in the SN 21 having the capacitor 16 are simultaneously performed in all the pixels 120 arranged in the pixel array unit 121. Thus, a global shutter is realized. Note that the period from the reset of the photoelectric conversion film 10 to the accumulation of the charge in the capacitor 16 corresponds to the exposure period.

Next, the reset transistor 11 is electrically conductive to reset the FD 20 having the capacitor 17. Then, the reset transistor 11 is turned off, and the transfer transistor 14 is turned on. Thus, the charges accumulated in the SN 21 having the capacitor 16 are transferred to the FD 20 and accumulated and held in the FD 20 having the capacitor 17.

The amplifier transistor 12 generates a pixel signal corresponding to the charge held in the FD 20 having the capacitor 17. Then, the select transistor 13 being electrically conductive allows the pixel signal generated by the amplifier transistor 12 to be outputted to the output signal line. The operation from the reset of the FD 20 to the output of the pixel signal is sequentially performed for each pixel circuit 1 arranged in the pixel array. The output of the pixel signals is processed in all the pixel circuits 1 of the pixel array to generate a frame which is a pixel signal for one screen.

Figure 8:
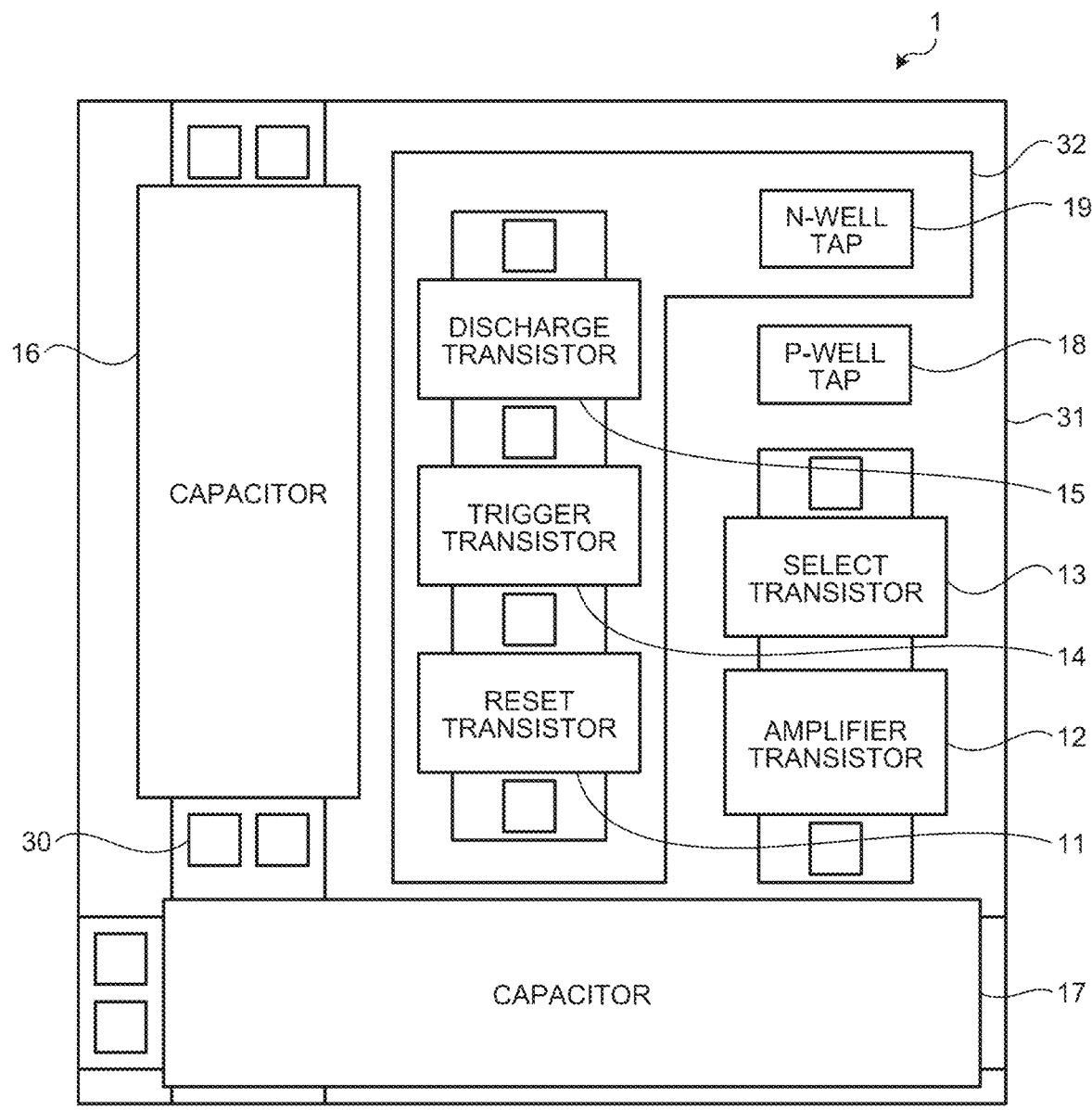
FIG. 8 is a diagram illustrating the layout of a pixel circuit according to an embodiment of the present disclosure.

The layout of the pixel circuit 1 will be further described with reference to FIG. 8. FIG. 8 is a diagram illustrating the layout of a pixel circuit according to an embodiment of the present disclosure.

The pixel circuit 1 has a P-well 31 and an N-well 32. The N-well 32 is arranged on the P-well 31. The amplifier transistor 12 and the select transistor 13 are both NMOSs, and are preferably arranged linearly on the P-well 31 in order to share diffusion layers such as the SN 21 and the FD 20, respectively. The reset transistor 11, the transfer transistor 14, and the discharge transistor 15 are PMOSs and are preferably arranged linearly on the N-well 32 in order to share the diffusion layer. The amplifier transistor 12 and the select transistor 13 being linearly arranged, and the reset transistor 11, the transfer transistor 14 and the discharge transistor 15 being linearly arranged are arranged in parallel in the longitudinal direction.

Each pixel 120 has a lattice shape, and the capacitors 16 and 17 are arranged in the remaining regions other than the regions where the reset transistor 11 to the discharge transistor 15 are arranged in the frame of each pixel 120. As described above, the capacitance of the capacitor 16 may be larger than the capacitance of the capacitor 17, and the occupied area of the capacitor 16 in the layout becomes smaller than the occupied area of the capacitor 17. The SN 21 is connected to a wiring electrically connected to the photoelectric conversion film 10. On the other hand, the FD 20 is connected to a gate of the amplifier transistor 12. As described above, since the FD 20 is connected to the amplifier transistor 12, the capacitor 17 to be capacitance of the FD 20, is arranged as a high capacitive element on the side close to the amplifier transistor 12. In other words, the capacitor 17 is arranged near the amplifier transistor 12. Thus, the wiring can be simplified, and the generation of noise such as crosstalk can be suppressed. In addition, the capacitor 16 to be capacitance of the SN 21 is arranged in the remaining region. In other words, the capacitor 16 is arranged side by side with the reset transistor 11, the transfer transistor 14 and the discharge transistor 15 arranged in series. For example, the longitudinal direction of the capacitor 17 is arranged in a direction orthogonal to the longitudinal direction of the capacitor 16.

Further, a P-well tap 18 is arranged on the P-well 31. The P-well tap 18 is arranged on the opposite side of the amplifier transistor 12 which holds select transistor 13 in between. The P-well tap 18 is connected to a power supply.

The reset transistor 11 is arranged near the amplifier transistor 12. The reset transistor 11, the transfer transistor 14, and the discharge transistor 15 are arranged in this order. Further, an N-well tap 19 is arranged on the N-well 32. The N-well tap 19 is arranged near the P-well tap 18. The N-well tap 19 is connected to the power supply. The capacitor 16 is arranged near the transfer transistor 14 and the discharge transistor 15. The capacitor 16 is then connected to the SN 21 having no other connecting element on the N-well 32. In addition, contacts 30 are arranged side by side between the capacitors 16 and 17 to shield between the intra-pixel capacitances. The contact 30 is an example of a "shielding member".

Figure 9:
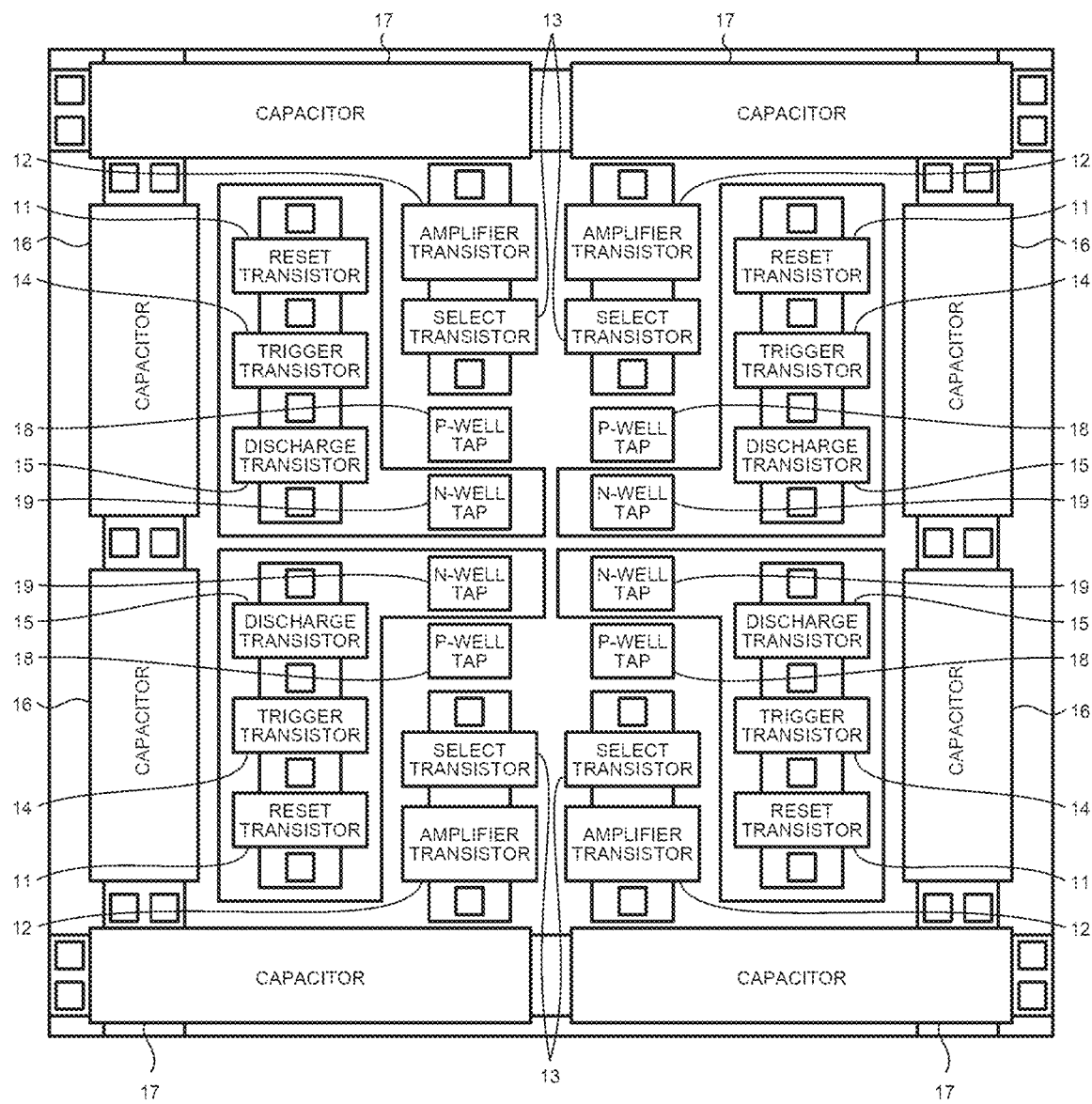
FIG. 9 is a diagram illustrating the arrangement of a plurality of pixel circuits.
Figure 10:
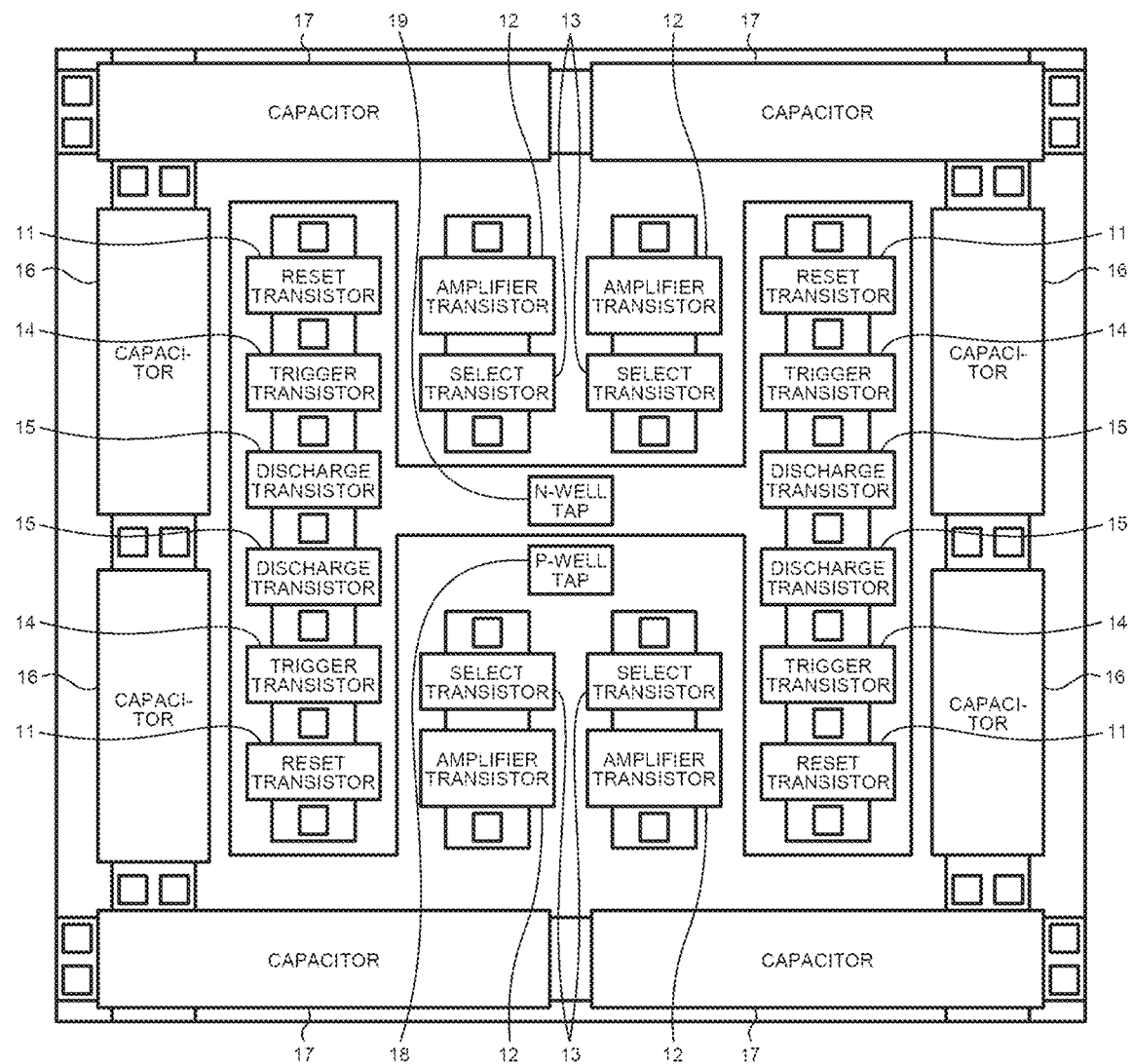
FIG. 10 is an arrangement diagram when a P-well tap and an N-well tap are shared.

FIG. 9 is a diagram illustrating the arrangement of a plurality of pixel circuits. For example, the pixel circuit 1 having the layout illustrated in FIG. 8 can have a two-by-two mirror arrangement as illustrated in FIG. 9. Although four N-well taps 19 are illustrated in FIG. 9, the four N-well taps 19 may be shared as one N-well tap 19 as illustrated in FIG. 10, thereby improving the layout efficiency. FIG. 10 is an arrangement diagram when a P-well tap and an N-well tap are shared. However, in the pixel circuit 1 according to the present embodiment having two floating nodes (the FD 20 and the SN 21), since the symmetry of the parasitic capacitance is important, the four N-well taps 19 are arranged without intentionally making the four N-well taps shared.

Figure 11:
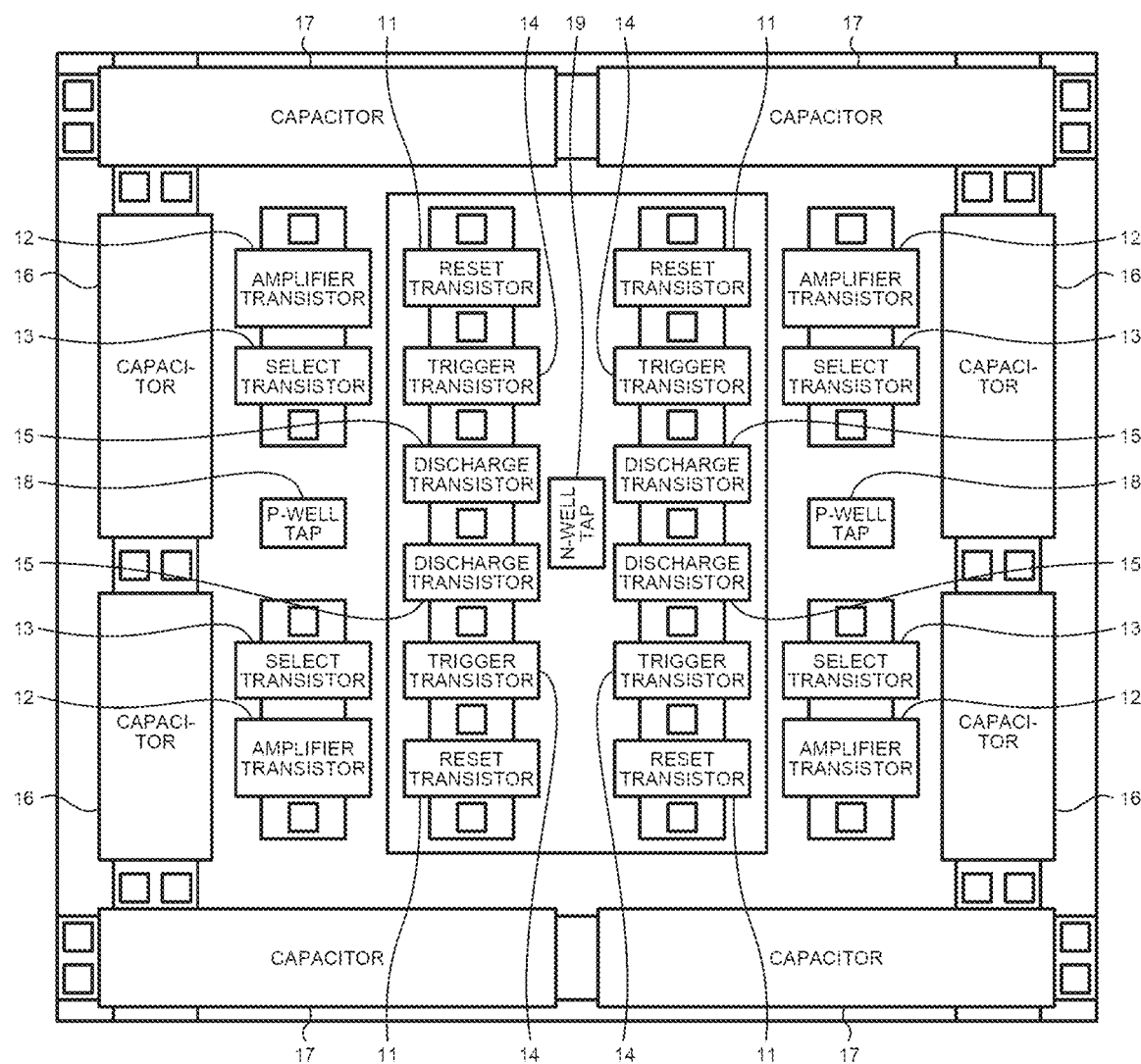
FIG. 11 is a diagram illustrating another first example of the arrangement of a plurality of pixel circuits.
Figure 12A:
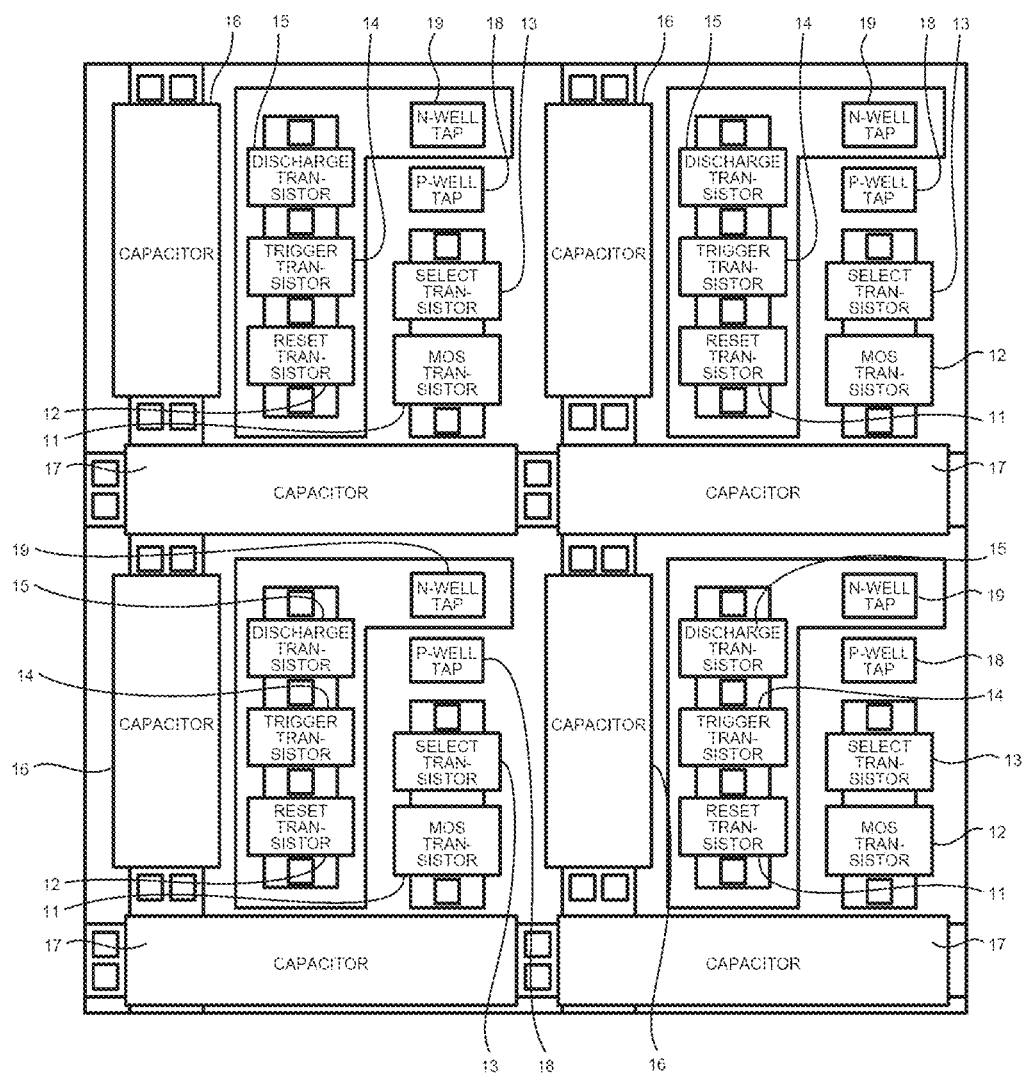
FIG. 12A is a diagram illustrating another second example of the arrangement of a plurality of pixel circuits.
Figure 12B:
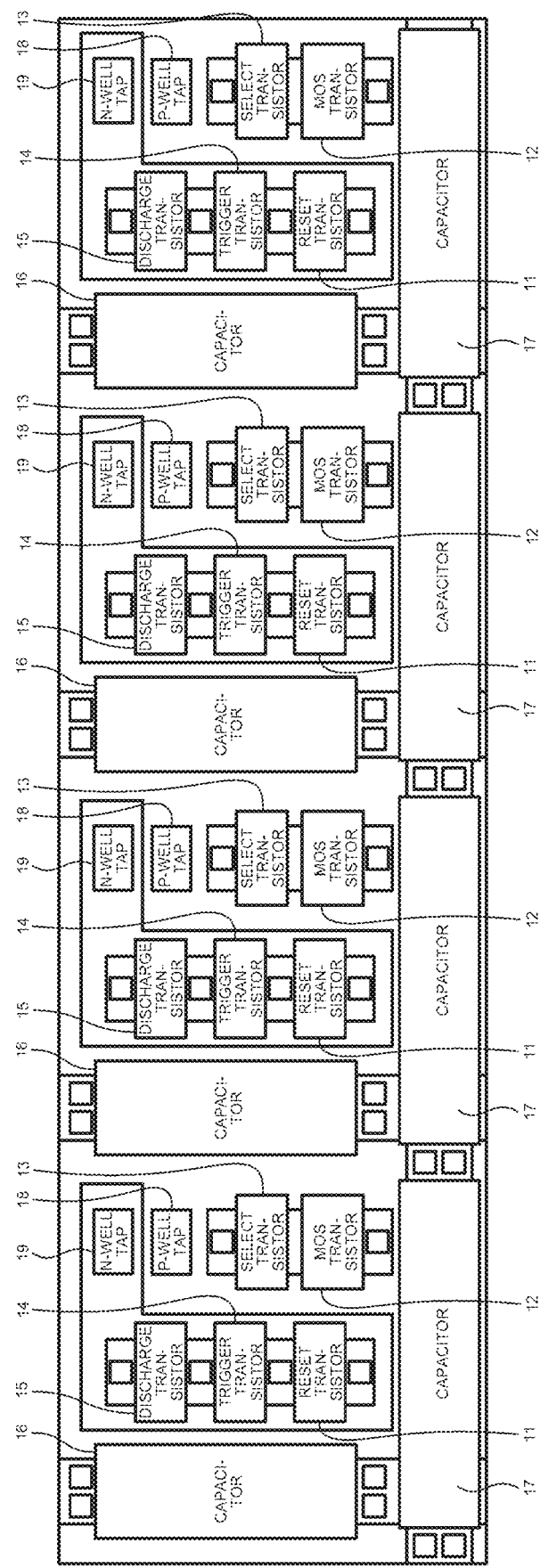
FIG. 12B is a diagram illustrating another third example of the arrangement of the plurality of pixel circuits.

The pixel circuit 1 can also be arranged in a different arrangement from the arrangement illustrated in FIG. 9. For example, in FIG. 9, the N-well taps 19 are arranged in an H-shaped manner when viewed from the front, but as illustrated in FIG. 11, the N-well taps 19 are integrated into one N-well tap being arranged at the center, and the reset transistor 11, the transfer transistor 14, and the discharge transistor 15 being linearly arranged may be arranged in an I-shaped manner so that the longitudinal directions of these transistors are arranged in two lines on the upper side and in two lines on the lower side when viewed from the front. FIG. 11 is a diagram illustrating another first example of the arrangement of a plurality of pixel circuits. In this case as well, the layout efficiency can be improved by making the N-well tap 19 shared. Alternatively, as illustrated in FIGS. 12A and 12B, the pixel circuits 1 as illustrated in FIG. 9 may be arranged in parallel without changing the direction of the pixel circuit. FIG. 12A is a diagram illustrating another second example of the arrangement of a plurality of pixel circuits. FIG. 12B is a diagram illustrating another third example of the arrangement of the plurality of pixel circuits. Such an arrangement can reduce noise.

Figure 13:
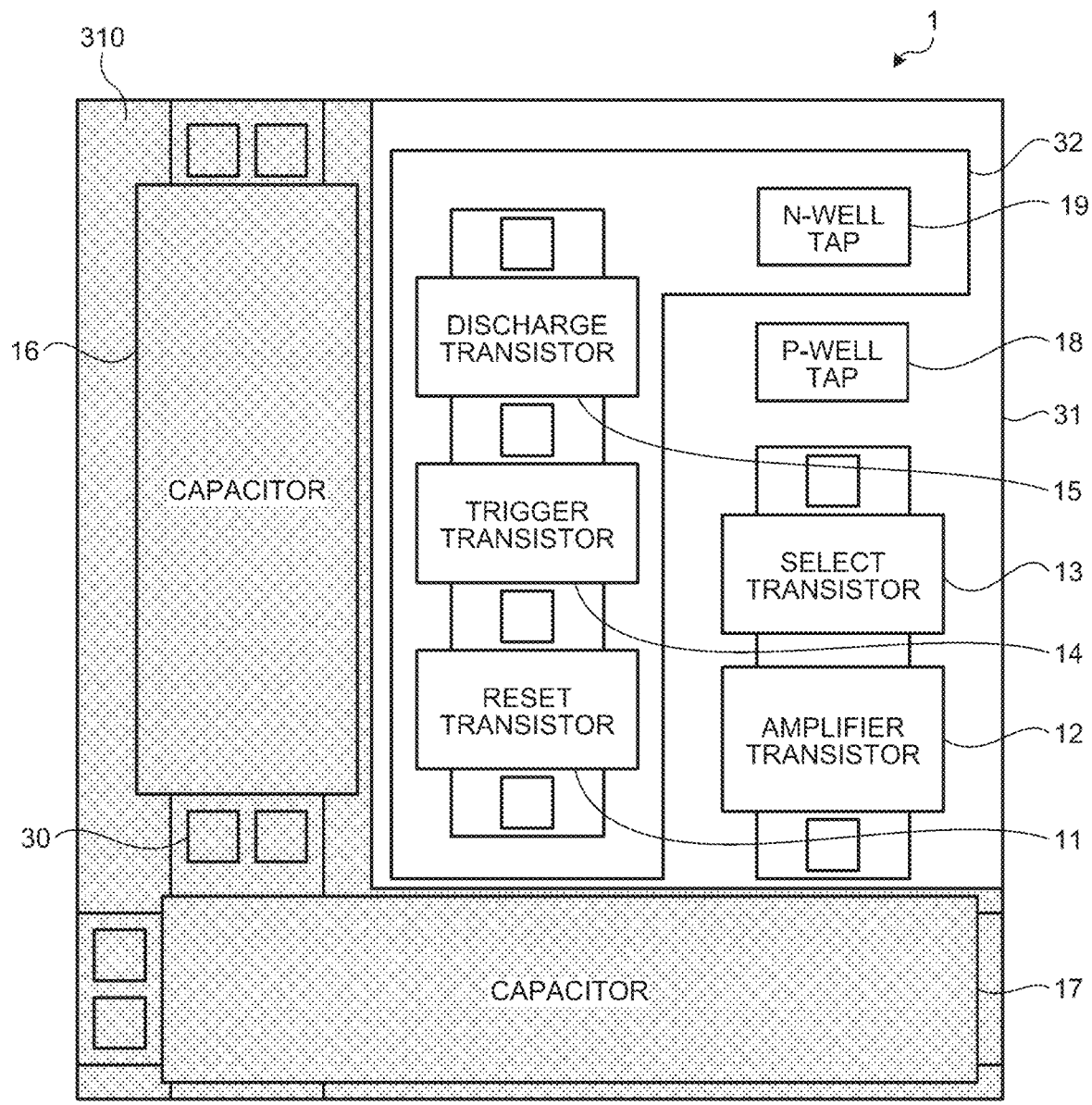
FIG. 13 is a diagram illustrating another example of the layout of the pixel circuit.

FIG. 13 is also a diagram illustrating another example of the layout of the pixel circuit. The layout illustrated in FIG. 13 is the same as the layout illustrated in FIG. 8 with respect to the arrangement of each of the transistors and the capacitors 16 and 17. In this case, however, the capacitors 16 and 17 to be floating nodes are covered with a first metal 310. Thus, electrical shielding can be realized with respect to a signal wire wired with a second metal or more. In this case, the wiring of the Si-side power supply of the capacitors 16 and 17 can be shared.

Operation and Effect

As described above, the pixel circuit 1 according to the present embodiment is an FD holding type GS, and has a photoelectric conversion film 10 using holes as photoelectric conversion carriers. In the pixel circuit 1 according to the present embodiment, the capacitors 16 and 17, which are high capacitive elements compared with the other pieces of capacitance, are arranged in the FD 20 and the SN 21.

Thus, the pixel circuit 1 according to the present embodiment can increase the number of saturated charges Qs. The random noise can also be minimized by designing so that the total capacitance of the FD 20 and the total capacitance of the SN 21 substantially match each other. In particular, when the capacitor 16 is not provided, the SN 21 does not become a photo diode (PD) of a perfect transfer type, and thus makes difficult to realize cancellation of the kTC noise by correlated double sampling (CDS: Correlated Double Sampling). On the other hand, the provision of the capacitor 16 enables the SN 21 to approximate the PD of the perfect transfer type and to cancel the kTC noise. Thus, the dynamic range of the pixel circuit 1 can be secured widely, and the image quality can be improved.

Further, since the capacitors 16 and 17 are the dominant components of the total capacitance of the FD 20 and the total capacitance of the SN 21, the pieces of capacitance serving as the dominant components can be equalized, and robustness against manufacturing variations can be secured. In addition, since the dominant components are the pieces of electrostatic capacitance of the capacitors, the possibility of variations in capacitance in the same direction increases, and the risk of characteristic variations can be reduced.

Modification Example 1 of Embodiment of Present Disclosure

Figure 14:
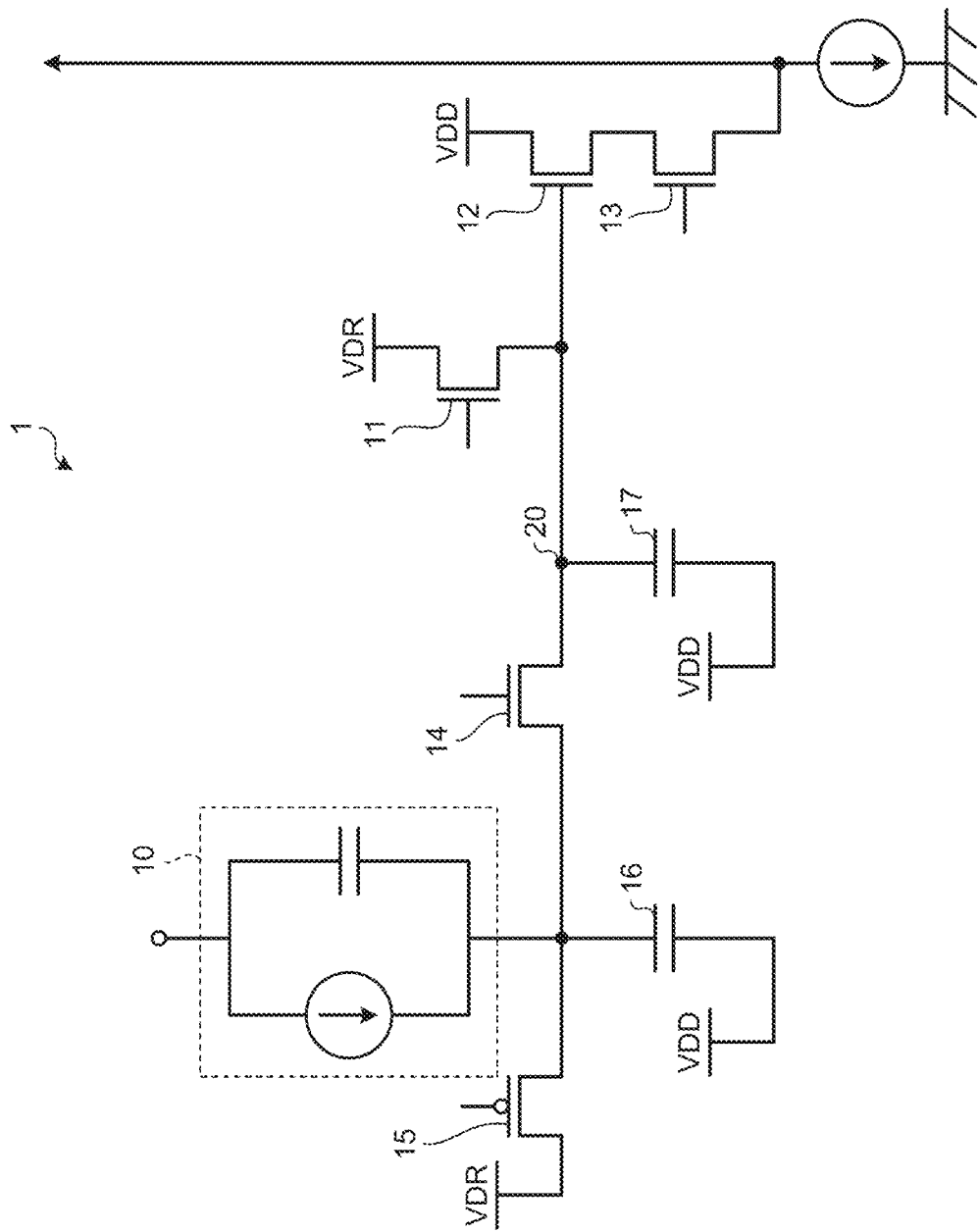
FIG. 14 is a circuit diagram of a pixel circuit according to a modification example 1 of an embodiment of the present disclosure.

FIG. 14 is a circuit diagram of a pixel circuit according to a modification example 1 of an embodiment of the present disclosure. As illustrated in FIG. 14, the pixel circuit 1 according to the present modification example differs from the embodiment of the present disclosure in that the reset transistor 11 and the transfer transistor 14 are NMOSs. In FIG. 14, the pieces of capacitance 18 and 19 illustrated in FIG. 3 are not illustrated.

The reset transistor 11, the amplifier transistor 12, the select transistor 13, and the transfer transistor 14 are NMOSs. On the other hand, the discharge transistor 15 is a PMOS.

Further, in the present modification example, the SN 21 is provided with the capacitor 16 which is a high capacitive element. The FD 20 is provided with the capacitor 17 which is a high capacitive element. In this case as well, the total capacitance of the SN 21 is determined to ensure a desired number of saturated charges, and the capacitor 16 has electrostatic capacitance whose total capacitance of the SN 21 is the determined value. The capacitor 17 also has electrostatic capacitance that substantially matches the total capacitance of the FD 20 and the total capacitance of the SN 21.

As described above, in the pixel circuit 1 according to the present modification example, a PMOS is used for the discharge transistor 15. Further, the capacitor 16 is arranged in the SN 21, and the capacitor 17 is arranged in the FD 20. Even such a configuration can increase the number of saturated charges Qs, reduce the random noise, and secure a wide dynamic range of the pixel circuit 1 to improve image quality. In addition, the robustness against manufacturing variations can be secured and the risk of characteristic variations can be reduced.

In this case, since sharing the diffusion layer becomes difficult among the reset transistor 11, the transfer transistor 14, and the discharge transistor 15, the layout efficiency is lower than that of the pixel circuit 1 according to the second embodiment. However, since an overflow path is not formed at a position adjacent to the FD 20, sunspot resistance is improved. In addition, since the amplifier transistor 12 and the select transistor 13 are NMOSs, the pixel circuit 1 according to the present modification example is compatible with a peripheral circuit using an NMOS.

Modification Example 2 of Embodiment of Present Disclosure

Figure 15:
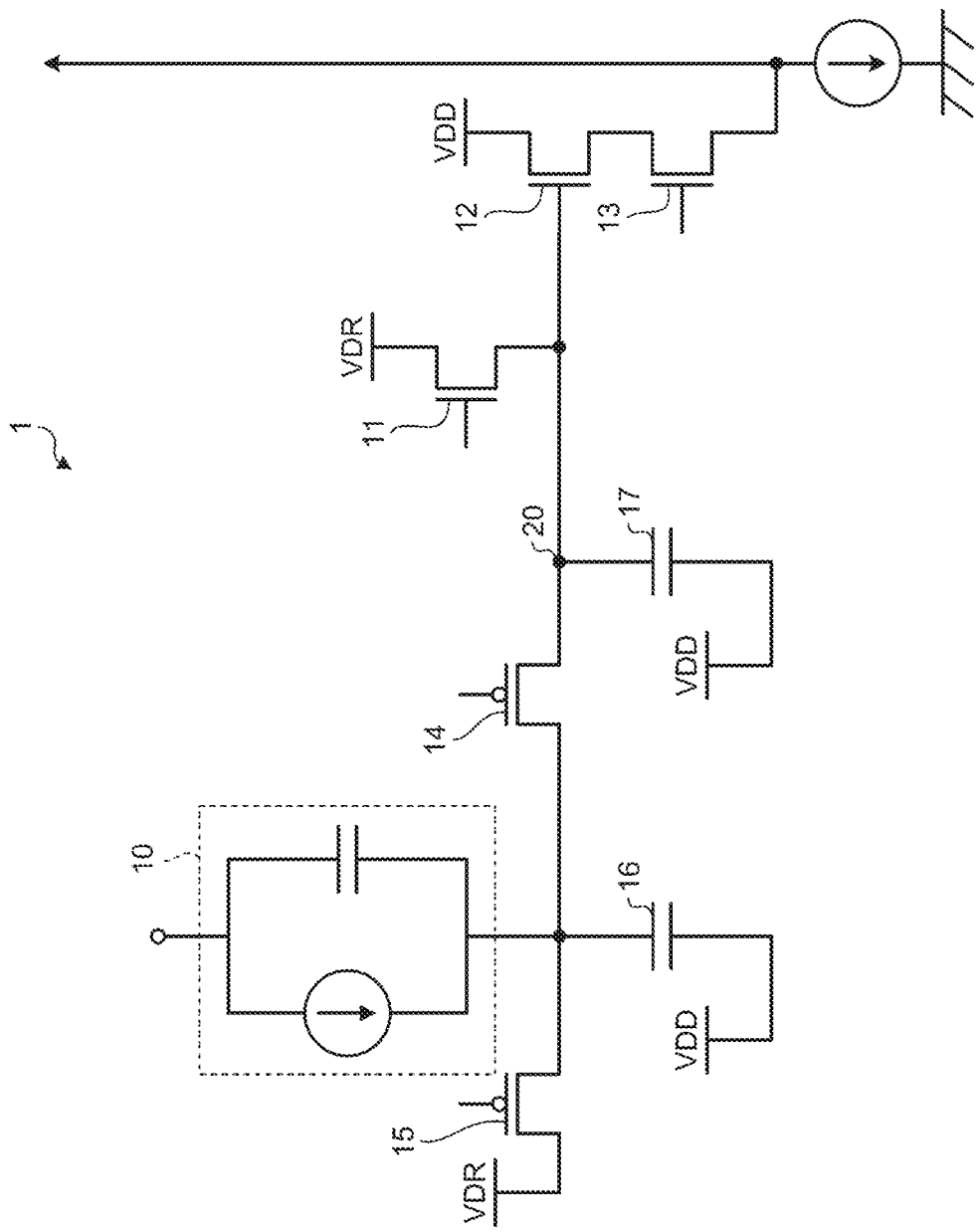
FIG. 15 is a circuit diagram of a pixel circuit according to a modification example 2 of an embodiment of the present disclosure.

FIG. 15 is a circuit diagram of a pixel circuit according to a modification example 2 of an embodiment of the present disclosure. As illustrated in FIG. 15, the pixel circuit 1 according to the modification example differs from the embodiment of the present disclosure in that the reset transistor 11 is an NMOS. In FIG. 15, the pieces of capacitance 18 and 19 illustrated in FIG. 3 are not illustrated.

The reset transistor 11, the amplifier transistor 12, and the select transistor 13 are NMOSs. On the other hand, the transfer transistor 14 and the discharge transistor 15 are PMOSs.

Further, in the present modification example, the SN 21 is provided with the capacitor 16 which is a high capacitive element. The FD 20 is provided with the capacitor 17 which is a high capacitive element. In this case as well, the total capacitance of the SN 21 is determined to ensure a desired number of saturated charges, and the capacitor 16 has electrostatic capacitance whose total capacitance of the SN 21 is the determined value. The capacitor 17 also has electrostatic capacitance that substantially matches the total capacitance of the FD 20 and the total capacitance of the SN 21.

As described above, in the pixel circuit 1 according to the present modification example, a PMOS is used for both the discharge transistor 15 and the transfer transistor 14. Further, the capacitor 16 is arranged in the SN 21, and the capacitor 17 is arranged in the FD 20. Even such a configuration can increase the number of saturated charges Qs, reduce the random noise, and secure a wide dynamic range of the pixel circuit 1 to improve image quality. In addition, the robustness against manufacturing variations can be secured and the risk of characteristic variations can be reduced.

In this case, since sharing the diffusion layer become difficult among the reset transistor 11, the transfer transistor 14, and the discharge transistor 15, the layout efficiency is lower than that of the pixel circuit 1 of the second embodiment. However, since the amplifier transistor 12 and the select transistor 13 are NMOSs, the pixel circuit 1 according to the present modification example is compatible with a peripheral circuit using an NMOS.

Modification Example 3 of Embodiment of Present Disclosure

Figure 16:
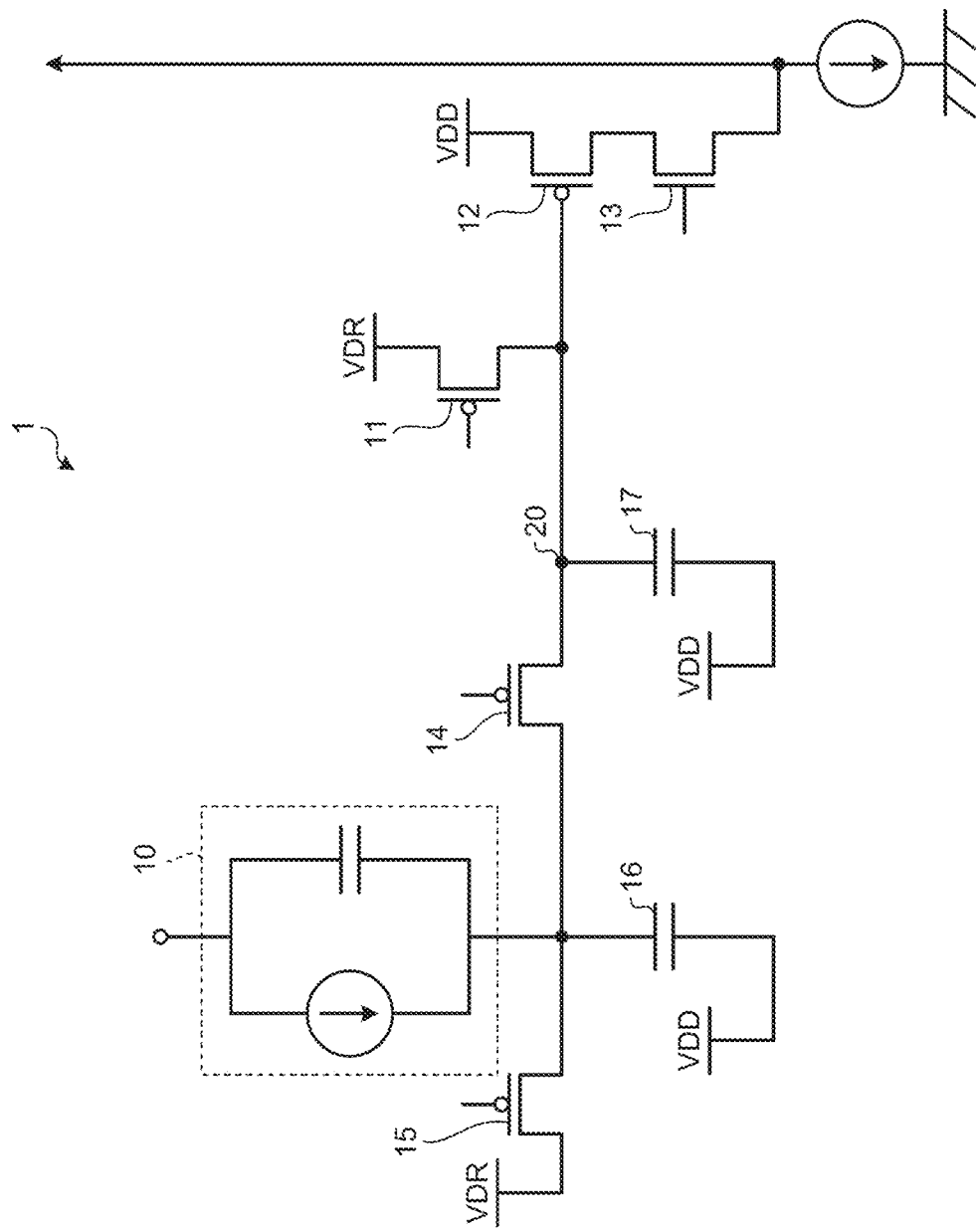
FIG. 16 is a circuit diagram of a pixel circuit according to a modification example 3 of an embodiment of the present disclosure.

FIG. 16 is a circuit diagram of a pixel circuit according to a modification example 3 of an embodiment of the present disclosure. As illustrated in FIG. 16, the pixel circuit 1 according to the present modification example differs from the embodiment of the present disclosure in that the amplifier transistor 12 is a PMOS. In FIG. 16, the pieces of capacitance 18 and 19 illustrated in FIG. 3 are not illustrated.

The select transistor 13 is an NMOS. On the other hand, the reset transistor 11, the amplifier transistor 12, the transfer transistor 14, and the discharge transistor 15 are PMOSs.

Further, in the present modification example, the SN 21 is provided with the capacitor 16 which is a high capacitive element. The FD 20 is provided with the capacitor 17 which is a high capacitive element. In this case as well, the total capacitance of the SN 21 is determined to ensure a desired number of saturated charges, and the capacitor 16 has electrostatic capacitance whose total capacitance of the SN 21 is the determined value. The capacitor 17 also has electrostatic capacitance that substantially matches the total capacitance of the FD 20 and the total capacitance of the SN 21.

As described above, in the pixel circuit 1 according to the present modification example, a PMOS is used for the reset transistor 11, the amplifier transistor 12, the transfer transistor 14, and the discharge transistor 15. Further, the capacitor 16 is arranged in the SN 21, and the capacitor 17 is arranged in the FD 20. Even such a configuration can increase the number of saturated charges Qs, reduce the random noise, and secure a wide dynamic range of the pixel circuit 1 to improve image quality. In addition, the robustness against manufacturing variations can be secured and the risk of characteristic variations can be reduced.

In this case, since sharing the diffusion layer becomes difficult between the amplifier transistor 12 and the select transistor 13, the layout efficiency is lower than that of the pixel circuit 1 according to the second embodiment. In addition, since the amplifier transistor 12 is a PMOS, a peripheral circuit is also required to cope with a change to a configuration using a PMOS.

Modification Example 4 of Embodiment of Present Disclosure

Figure 17:
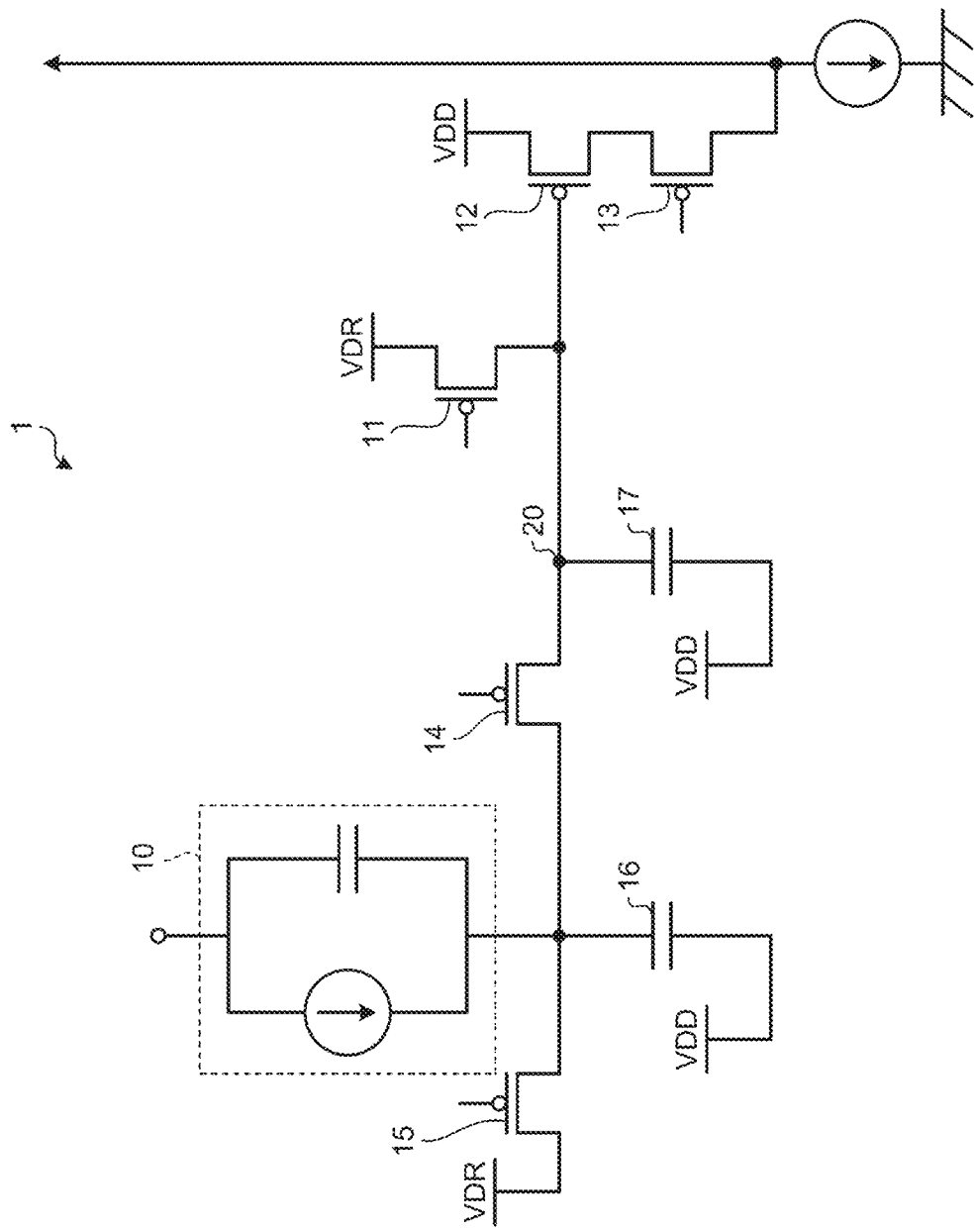
FIG. 17 is a circuit diagram of a pixel circuit according to a modification example 4 of an embodiment of the present disclosure.

FIG. 17 is a circuit diagram of a pixel circuit according to a modification example 4 of an embodiment of the present disclosure. As illustrated in FIG. 17, the pixel circuit 1 according to the present modification example differs from the embodiment of the present disclosure in that the amplifier transistor 12 and the select transistor 13 are PMOSs. In FIG. 17, the pieces of capacitance 18 and 19 illustrated in FIG. 3 are not illustrated.

The reset transistor 11, the amplifier transistor 12, the select transistor 13, the transfer transistor 14, and the discharge transistor 15 are all PMOSs.

Further, in the present modification example, the SN 21 is provided with the capacitor 16 which is a high capacitive element. The FD 20 is provided with the capacitor 17 which is a high capacitive element. In this case as well, the total capacitance of the SN 21 is determined to ensure a desired number of saturated charges, and the capacitor 16 has electrostatic capacitance whose total capacitance of the SN 21 is the determined value. The capacitor 17 also has electrostatic capacitance that substantially matches the total capacitance of the FD 20 and the total capacitance of the SN 21.

In this case, in the layout of the pixel circuit 1 illustrated in FIG. 8, the reset transistor 11, the amplifier transistor 12, the select transistor 13, the transfer transistor 14 and the discharge transistor 15, and the capacitors 16 and 17 are arranged on the N-well. In this case, if the N-well tap 19 is arranged, the P-well tap 18 may not be arranged. As described above, in the pixel circuit 1 according to the present modification example, since only one N-well tap 19 needs to be arranged, the layout efficiency can be improved as compared with the pixel circuit 1 according to the second embodiment and its modification examples 1 to 3.

As described above, in the pixel circuit 1 according to the present modification example, a PMOS is used for all of the reset transistor 11, the amplifier transistor 12, the select transistor 13, the transfer transistor 14, and the discharge transistor 15. Further, the capacitor 16 is arranged in the SN 21, and the capacitor 17 is arranged in the FD 20. Even such a configuration can increase the number of saturated charges Qs, reduce the random noise, and secure a wide dynamic range of the pixel circuit 1 to improve image quality. In addition, the robustness against manufacturing variations can be secured and the risk of characteristic variations can be reduced.

In the pixel circuit 1 according to the present modification example, since all the MOS transistors are PMOSs, all the MOS transistors can be formed by arranging the source and drain on the N-Well arranged on the P-type diffusion layer. Thus, the manufacturing process of the pixel circuit can be simplified and the manufacturing cost can be reduced.

In this case, since the diffusion layer can be shared among the reset transistor 11, the amplifier transistor 12, the select transistor 13, the transfer transistor 14, and the discharge transistor 15, the layout efficiency is higher than that of the second embodiment. However, since the amplifier transistor 12 and the select transistor 13 are PMOSs, a peripheral circuit is also required to cope with a change to a configuration using a PMOS.

2. Application Examples

Figure 18A:
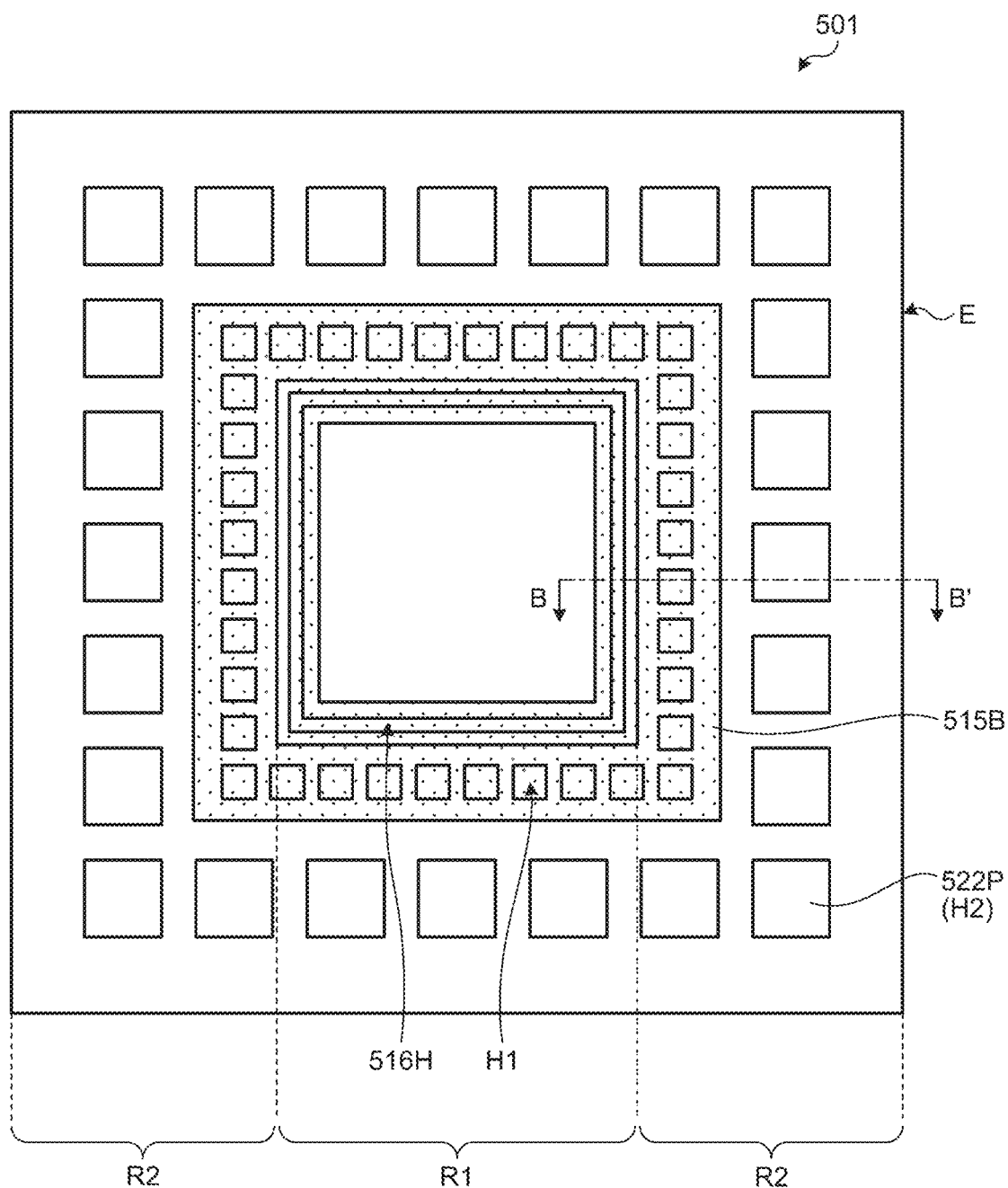
FIG. 18A is a diagram illustrating a plan configuration of a light receiving element.
Figure 18B:
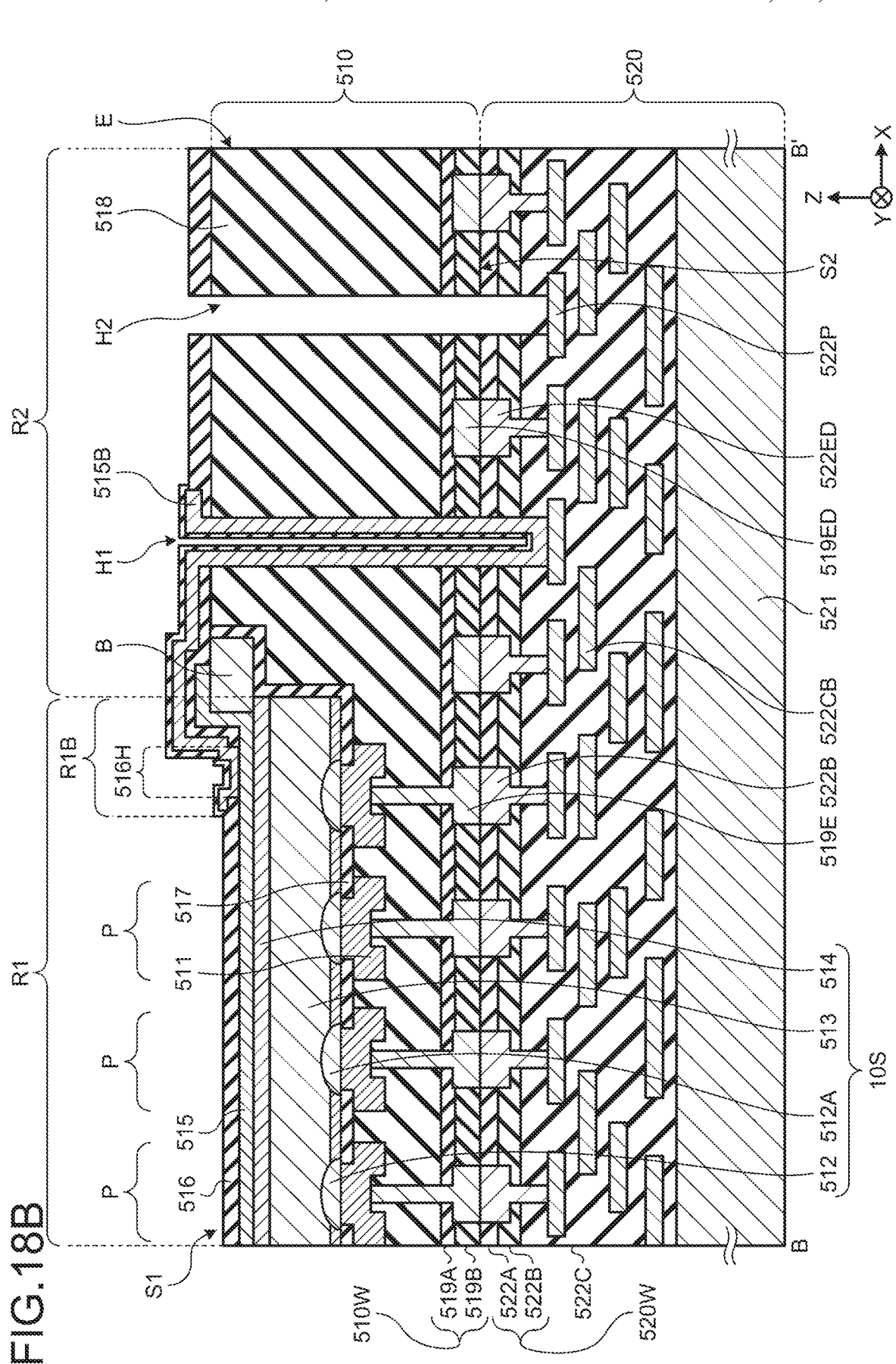
FIG. 18B is a diagram illustrating a cross-sectional configuration taken along line B-B' of FIG. 18A.

Configuration examples to which the pixel circuit 1 described in each of the above embodiments can be applied will be then described. FIG. 18A is a diagram illustrating a plan configuration of a light receiving element. FIG. 18B is a diagram illustrating a cross-sectional configuration taken along line B-B' of FIG. 18A. For example, each of the pixel circuits 1 described in each embodiment and each modification example can be applied to the light receiving element illustrated in FIGS. 18A and 18B.

The light receiving element 501 is applied, for example, to an infrared sensor using a compound semiconductor material such as a group III-V semiconductor, and has a photoelectric conversion function for light having a wavelength in a visible region (e.g., 380 nm or more and 780 nm or less) to a short infrared region (e.g., 780 nm or more and 2400 nm or less), for example. The light receiving element 501 is provided with, for example, a plurality of light receiving unit regions P (pixel P) arranged two-dimensionally as illustrated in FIG. 18B.

The light receiving element 501 is applied, for example, to an infrared sensor using a compound semiconductor material such as a group III-V semiconductor, and has a photoelectric conversion function for light having a wavelength in a visible region (e.g., 380 nm or more and 780 nm or less) to a short infrared region (e.g., 780 nm or more and 2400 nm or less), for example. The light receiving element 501 is provided with, for example, a plurality of light receiving unit regions P (pixel P) arranged two-dimensionally.

The light receiving element 501 has an element region R1 at the center and a peripheral region R2 provided outside the element region R1 and surrounding the element region R1 as illustrated in FIG. 18A. The light receiving element 501 has a conductive film 515B provided from the element region R1 to the peripheral region R2. The conductive film 515B has an opening in a region facing the center of the element region R1.

The light receiving element 501 has a laminated structure of an element substrate 510 and a readout circuit substrate 520. One face of the element substrate 510 is a light incident face (light incident face S1), and a face (the other face) opposite to the light incident face S1 is a bonded face (bonded face S2) with the readout circuit substrate 520.

The element substrate 510 has a wiring layer 510W, a first electrode 511, a semiconductor layer 510S (first semiconductor layer), a second electrode 515, and a passivation film 516 in this order from a position close to the readout circuit substrate 520. The face of the semiconductor layer 510S facing the wiring layer 510W and the end face (side face) are covered with an insulating film 517. The readout circuit substrate 520 is a so-called readout integrated circuit (ROIC), and has a wiring layer 520W and a multilayer wiring layer 522C in contact with the bonded face S2 of the element substrate 510, and a semiconductor substrate 521 facing the element substrate 510 by holding the wiring layer 520W and the multilayer wiring layer 522C in between.

The element substrate 510 has a semiconductor layer 510S in an element region R1. In other words, the region where the semiconductor layer 510S is provided is the element region R1 of the light receiving element 501. In the element region R1, a region (region facing the opening of the conductive film 515B) exposed from the conductive film 515B is a light receiving region. In the element region R1, a region covered with the conductive film 515B is an optical black (OPB) region R1B. The OPB region R1B is provided so as to surround the light receiving region. The OPB region R1B is used to obtain a black level pixel signal. The element substrate 510 has a buried layer 518 together with the insulating film 517 in the peripheral region R2. The peripheral region R2 is provided with through-holes H1 and H2 which penetrate the element substrate 510 and reach the readout circuit substrate 520. In the light receiving element 501, light enters the semiconductor layer 510S from the light incident face S1 of the element substrate 510 through the passivation film 516, the second electrode 515, and a second contact layer 514. The signal charge photoelectrically converted in the semiconductor layer 510S moves through the first electrode 511 and the wiring layer 510W, and is read out by the readout circuit substrate 520. The configuration of each portion will be described below.

The wiring layer 510W is provided across the element region R1 and the peripheral region R2, and has the bonded face S2 with the readout circuit substrate 520. In the light receiving element 501, the bonded face S2 of the element substrate 510 is provided in the element region R1 and the peripheral region R2, and the bonded face S2 of the element region R1 and the bonded face S2 of the peripheral region R2, for example, form the same plane. As will be described below, in the light receiving element 501, the bonded face S2 of the peripheral region R2 is formed by providing the buried layer 518.

The wiring layer 510W has, for example, a contact electrode 519E and a dummy electrode 519ED in interlayer insulating films 519A and 519B. For example, the interlayer insulating film 519B is arranged on the readout circuit substrate 520 side, and the interlayer insulating film 519A is arranged on the first contact layer 512 side, and these interlayer insulating films 519A and 519B are laminated. The interlayer insulating films 519A and 519B are made of, for example, an inorganic insulating material. The inorganic insulating material includes, for example, silicon nitride (SiN), aluminum oxide ($Al_2O_3$), silicon oxide ($SiO_2$), and hafnium oxide ($HfO_2$). The interlayer insulating films 519A and 519B may be formed of the same inorganic insulating material.

The contact electrode 519E is provided, for example, in the element region R1. The contact electrode 519E electrically connects the first electrode 511 and the readout circuit substrate 520, and is provided for each pixel P in the element region R1. Adjacent contact electrodes 519E are electrically separated by the buried layer 518 and the interlayer insulating films 519A and 519B. The contact electrode 519E is formed of, for example, a copper (Cu) pad, and is exposed to the bonded face S2. The dummy electrode 519ED is provided, for example, in the peripheral region R2. The dummy electrode 519ED is connected to a dummy electrode 522ED of the wiring layer 520W to be described below. The provision of the dummy electrode 519ED and the dummy electrode 522ED enables the strength of the peripheral region R2 to be improved. The dummy electrode 519ED is formed in the same process as the contact electrode 519E, for example. The dummy electrode 519ED is formed of, for example, a copper (Cu) pad, and is exposed to the bonded face S2.

The first electrode 511 provided between the contact electrode 519E and the semiconductor layer 510S is an electrode (anode) to which a voltage for reading out a signal charge (a hole or an electron, hereinafter, for convenience, will be described assuming that the signal charge is a hole) generated in a photoelectric conversion layer 513 is supplied, and is provided for each pixel P in the element region R1. The first electrode 511 is provided so as to fill the opening of the insulating film 517 and is in contact with the semiconductor layer 510S (more specifically, a diffusion region 512A described below). The first electrode 511 is larger than, for example, the opening of the insulating film 517, and a part of the first electrode 511 is provided in the buried layer 518. In other words, the upper face (face of the semiconductor layer 510S) of the first electrode 511 is in contact with the diffusion region 512A, and a part of the lower face and the side face of the first electrode 511 are in contact with the buried layer 518. The adjacent first electrodes 511 are electrically separated by the insulating film 517 and the buried layer 518.

The first electrode 511 is made of, for example, any one of titanium (Ti), tungsten (W), titanium nitride (TiN), platinum (Pt), gold (Au), germanium (Ge), palladium (Pd), zinc (Zn), nickel (Ni), and aluminum (Al), or an alloy containing at least one of these elements. The first electrode 511 may be a single film made of such a constituent material, or may be a laminated film formed by combining two or more types of the materials. For example, the first electrode 511 is composed of a laminated film of titanium and tungsten. The thickness of the first electrode 511 is, for example, several tens nm to several hundred nm.

The semiconductor layer 510S includes, for example, the first contact layer 512, the photoelectric conversion layer 513, and the second contact layer 514 from a position close to the wiring layer 510W. The first contact layer 512, the photoelectric conversion layer 513, and the second contact layer 514 have the same planar shape, and the end faces of these layers are arranged at the same position in plan view.

The first contact layer 512 is provided in common to all the pixels P, for example, and is arranged between the insulating film 517 and the photoelectric conversion layer 513. The first contact layer 512 electrically separates adjacent pixels P, and the first contact layer 512 is provided with, for example, a plurality of diffusion regions 512A. Dark current can be suppressed by using a compound semiconductor material having a band gap larger than a band gap of the compound semiconductor material constituting the photoelectric conversion layer 513 for the first contact layer 512. For example, n-type InP (indium phosphide) can be used for the first contact layer 512.

The diffusion regions 512A provided in the first contact layer 512 are spaced from each other. The diffusion regions 512A are arranged for each pixel P, and the first electrodes 511 are connected to the respective diffusion regions 512A. The diffusion region 512A is also provided in the OPB region RIB. The diffusion region 512A reads out the signal charge generated in the photoelectric conversion layer 513 for each pixel P, and contains, for example, a p-type impurity. The p-type impurity includes, for example, Zn (zinc). Thus, a pn junction interface is formed between the diffusion region 512A and the first contact layer 512 other than the diffusion region 512A, and adjacent pixels P are electrically separated from each other. The diffusion region 512A is provided in the thickness direction of the first contact layer 512, for example, and is also provided in a part of the thickness direction of the photoelectric conversion layer 513.

The photoelectric conversion layer 513 between the first electrode 511 and the second electrode 515, more specifically, between the first contact layer 512 and the second contact layer 514 is provided, for example, in common to all pixels P. The photoelectric conversion layer 513 absorbs light of a predetermined wavelength to generate a signal charge, and is made of, for example, a compound semiconductor material such as a group III-V semiconductor of an i-type. The compound semiconductor material constituting the photoelectric conversion layer 513 include, for example, indium gallium arsenide (InGaAs), indium arsenide antimonide (InAsSb), indium arsenide (InAs), indium antimonide (InSb), and mercury cadmium tellurium (HgCdTe). The photoelectric conversion layer 513 may be formed of germanium (Ge). In the photoelectric conversion layer 513, for example, photoelectric conversion of light having a wavelength in the visible region to the short infrared region is performed.

The second contact layer 514 is provided in common to all the pixels P, for example. The second contact layer 514 is provided between the photoelectric conversion layer 513 and the second electrode 515 and is in contact with the photoelectric conversion layer and the second electrode. The second contact layer 514 is a region in which charges discharged from the second electrode 515 are transferred, and is made of, for example, a compound semiconductor containing an n-type impurity. For example, n-type InP (indium phosphide) can be used for the second contact layer 514.

The second electrode 515 is provided on the second contact layer 514 (light incident side) so as to be in contact with the second contact layer 514 as an electrode common to each pixel P, for example. The second electrode 515 (cathode) discharges charges that are not used as signal charges of the charges generated in the photoelectric conversion layer 513. For example, when holes are read out from the first electrode 511 as signal charges, electrons can be discharged through the second electrode 515, for example. The second electrode 515 is formed of a conductive film capable of transmitting incident light such as infrared light. For example, ITO (Indium Tin Oxide) or ITiO ($In_2O_3$—$TiO_2$) can be used for the second electrode 515. The second electrode 515 may be provided in a lattice shape so as to partition adjacent pixels P, for example. A conductive material having low light transmittance can be used for the second electrode 515.

The passivation film 516 covers the second electrode 515 from the light incident face S1 side. The passivation film 516 may have an antireflection function. The passivation film 516 may be made of, for example, silicon nitride (SiN), aluminum oxide ($Al_2O_3$), silicon oxide ($SiO_2$), and tantalum oxide ($Ta_2O_3$). The passivation film 516 has an opening 516H in the OPB region R1B. The opening 516H is formed, for example, in the shape of a frame surrounding the light receiving region as illustrated in FIG. 18A. The opening 516H may be, for example, a square or circular hole in plan view. The opening 516H of the passivation film 516 electrically connects the conductive film 515B to the second electrode 515.

The insulating film 517 is provided between the first contact layer 512 and the buried layer 518, covers the end face of the first contact layer 512, the end face of the photoelectric conversion layer 513, the end face of the second contact layer 514, and the end face of the second electrode 515, and is in contact with the passivation film 516 in the peripheral region R2. The insulating film 517 includes an oxide such as silicon oxide ($SiO_x$) or aluminum oxide ($Al_2O_3$). The insulating film 517 may be constituted by a laminated structure composed of a plurality of films. The insulating film 517 may be made of a silicon (Si) based insulating material such as silicon oxynitride (SiON), carbon-containing silicon oxide (SiOC), silicon nitride (SiN) and silicon carbide (SiC), for example. The thickness of the insulating film 517 is, for example, several tens nm to several hundred nm.

The conductive film 515B is provided from the OPB region R1B to the through-hole H1 of the peripheral region R2. The conductive film 515B is in contact with the second electrode 515 at the opening 516H of the passivation film 516 provided in the OPB region R1B, and is in contact with the wiring (wiring 522CB described below) of the readout circuit substrate 520 via the through-hole H1. Thus, a voltage is supplied from the readout circuit substrate 520 to the second electrode 515 through the conductive film 515B. The conductive film 515B functions as a voltage supply path to the second electrode 515, functions as a light shielding film, and forms the OPB region R1B. The conductive film 515B is made of, for example, a metal material containing tungsten (W), aluminum (Al), titanium (Ti), molybdenum (Mo), tantalum (Ta), or copper (Cu). A passivation film may be provided on the conductive film 515B.

An adhesive layer B may be provided between the end of the second contact layer 514 and the second electrode 515.

As will be described below, the adhesive layer B is used for forming the light receiving element 501, and serves to bond the semiconductor layer 510S to the temporary substrate. The adhesive layer B is made of, for example, tetraethoxysilane (TEOS) or silicon oxide ($SiO_2$). For example, the adhesive layer B is provided wider than the end face of the semiconductor layer 510S, and is covered with the buried layer 518 together with the semiconductor layer 510S. The insulating film 517 is provided between the adhesive layer B and the buried layer 518.

The buried layer 518 fills the step between the temporary substrate and the semiconductor layer 510S in the manufacturing process of the light receiving element 501. Although the details will be described below, in the present embodiment, since the buried layer 518 is formed, the occurrence of the defect in the manufacturing process caused by the step between the semiconductor layer 510S and the temporary substrate 533 can be suppressed.

The buried layer 518 in the peripheral region R2 is provided between the wiring layer 510W and the insulating film 517 and between the wiring layer 510W and the passivation film 516, and has a thickness equal to or greater than the thickness of the semiconductor layer 510S, for example. Here, since the buried layer 518 is provided to surround the semiconductor layer 510S, a region (peripheral region R2) around the semiconductor layer 510S is formed. Thus, the bonded face S2 with the readout circuit substrate 520 can be provided in the peripheral region R2. If the bonded face S2 is formed in the peripheral region R2, the thickness of the buried layer 518 may be reduced, but preferably the buried layer 518 covers the semiconductor layer 510S in the thickness direction and the entire end face of the semiconductor layer 510S is covered with the buried layer 518. Since the buried layer 518 covers the entire end face of the semiconductor layer 510S through the insulating film 517, the infiltration of moisture into the semiconductor layer 510S can be effectively reduced. The buried layer 518 of the element region R1 is provided between the semiconductor layer 510S and the wiring layer 510W so as to cover the first electrode 511.

The surface of the buried layer 518 on the side of the bonded face S2 is planarized, and the wiring layer 510W is provided on the surface of the planarized buried layer 518 in the peripheral region R2. The buried layer 518 may be made of an inorganic insulating material such as silicon oxide ($SiO_x$), silicon nitride (SiN), silicon oxynitride (SiON), carbon-containing silicon oxide (SiOC), and silicon carbide (SiC), for example.

In the process of manufacturing the light receiving element 501, after the buried layer 518 is formed, the wiring layer 510W including the interlayer insulating films 519A and 519B and the contact electrode 519E is formed above the buried layer 518. The readout circuit substrate 520 including a wiring layer 520W is laminated to an element substrate 510 including the wiring layer 510W to form the light receiving element 501. At this time, the contact electrode 519E of the wiring layer 510W is connected to the contact electrode 522E of the wiring layer 520W. The contact electrodes 519E and 522E have Cu pads, for example, and are connected to the contact electrodes 519E and 522E by direct bonding of the Cu pads. When the contact electrode 519E is formed by the chemical mechanical polishing (CMP) method, the buried layer 518 arranged below the copper film to be polished is required to have a hardness which can withstand the stress during polishing. Further, in order to directly bond the Cu pads of the contact electrodes 519E and 522E to each other, the element substrate 510 and the readout circuit substrate 520 are required to be formed extremely flat. Therefore, the buried layer 518 arranged below the copper film preferably has a hardness which can withstand the stress during polishing. Specifically, the material of the buried layer 518 is preferably a material having a hardness higher than a material of an encapsulant or an organic material arranged around the die in a typical semiconductor package. The material having such high hardness include, for example, an inorganic insulating material. The buried layer 518 can be formed by depositing the inorganic insulating material by, for example, the chemical vapor deposition (CVD), sputtering or coating.

The buried layer 518 is provided with the through-holes H1 and H2 passing through the buried layer 518. The through-holes H1 and H2, together with the buried layer 518, penetrate the wiring layer 510W and reach the readout circuit substrate 520. The through-holes H1 and H2 have a rectangular planar shape, for example, and each of the plurality of through-holes H1 and H2 is provided to surround the element region R1 as illustrated in FIG. 18A. The through-hole H1 is provided at a position closer to the element region R1 than the through-hole H2, and the side wall and the bottom face of the through-hole H1 are covered with the conductive film 515B. The through-hole H1 connects the second electrode 515 (conductive film 515B) to the wiring (wiring 522CB described below) of the readout circuit substrate 520, and is provided through the passivation film 516, the buried layer 518, and the wiring layer 510W.

The through-hole H2 is provided at a position closer to the chip end E than the through-hole H1, for example. The through-hole H2 passes through the passivation film 516, the buried layer 518, and the wiring layer 510W, and reaches the pad electrode (pad electrode 522P described below) of the readout circuit substrate 520. The light receiving element 501 is electrically connected to the outside through the through-hole H2. The through-holes H1 and H2 may not reach the readout circuit substrate 520. For example, the through-holes H1 and H2 may reach the wiring of the wiring layer 510W, and the wiring may be connected to the wiring 522CB and the pad electrode 522P of the readout circuit substrate 520. The through-holes H1 and H2 may penetrate through the adhesive layer B.

Holes and electrons generated in the photoelectric conversion layer 513 are read out from the first electrode 511 and the second electrode 515. In order to perform the readout operation at a high speed, the distance between the first electrode 511 and the second electrode 515 is preferably a distance sufficient for photoelectric conversion and not a distance spaced apart with each other too much. In other words, the thickness of the element substrate 510 is preferably reduced. For example, the distance between the first electrode 511 and the second electrode 515 or the thickness of the element substrate 510 is 10 µm or less, preferably 7 µm or less, and more preferably 5 µm or less.

The semiconductor substrate 521 of the readout circuit substrate 520 faces the element substrate 510 by holding the wiring layer 520W and the multilayer wiring layer 522C in between. The semiconductor substrate 521 is made of, for example, silicon (Si). A plurality of transistors is provided near the surface (surface of the wiring layer 520W side) of the semiconductor substrate 521. For example, a readout circuit (Read Out Circuit) is configured for each pixel P by using the plurality of transistors. As the readout circuit, the pixel circuit 1 described in each embodiment and each modification example can be used. The wiring layer 520W has, for example, an interlayer insulating film 522A and an interlayer insulating film 522B in this order from the element substrate 510 side, and the interlayer insulating films 522A and 522B are laminated. For example, the contact electrode 522E and the dummy electrode 522ED are provided in the interlayer insulating film 522A. The multilayer wiring layer 522C is provided facing the element substrate 510 by holding the wiring layer 520W in between. For example, the pad electrode 522P and a plurality of the wirings 522CB are provided in the multilayer wiring layer 522C. The interlayer insulating films 522A and 522B are made of, for example, an inorganic insulating material. The inorganic insulating material includes, for example, silicon nitride (SiN), aluminum oxide ($Al_2O_3$), silicon oxide ($SiO_2$), and hafnium oxide ($HfO_2$).

The contact electrode 522E electrically connects the first electrode 511 and the wiring 522CB, and is provided for each pixel P in the element region R1. The contact electrode 522E is in contact with the contact electrode 519E on the bonded face S2 of the element substrate 510. The adjacent contact electrodes 522E are electrically separated by the interlayer insulating film 522A.

The dummy electrode 522ED provided in the peripheral region R2 is in contact with the dummy electrode 519ED on the bonded face S2 of the element substrate 510. The dummy electrode 522ED is formed in the same process as the contact electrode 522E, for example. The contact electrode 522E and the dummy electrode 522ED are formed of, for example, copper (Cu) pads, and are exposed on the surface of the readout circuit substrate 520 facing the element substrate 510. In other words, for example, a CuCu bonding is formed between the contact electrode 519E and the contact electrode 522E, and between the dummy electrode 519ED and the dummy electrode 522ED. Thus, the pixel P can be miniaturized.

The wiring 522CB connected to the contact electrode 519E is connected to a transistor provided near the surface of the semiconductor substrate 521, and the first electrode 511 and the readout circuit are connected for each pixel P. The wiring 522CB connected to the conductive film 515B through the through-hole H1 is connected to a predetermined potential, for example. Thus, one (for example, a hole) of the charges generated in the photoelectric conversion layer 513 is read out from the first electrode 511 to the readout circuit through the contact electrodes 519E and 522E, and the other (for example, an electron) of the charges generated in the photoelectric conversion layer 513 is discharged to a predetermined potential from the second electrode 515 through the conductive film 515B.

The pad electrode 522P provided in the peripheral region R2 electrically connects with the outside. The through-hole H2 passing through the element substrate 510 and reaching the pad electrode 522P is provided near the chip end E of the light receiving element 501, and the light receiving element is electrically connected to the outside through the through-hole H2. The connection is made, for example, by a method such as wire bonding or bump. For example, a predetermined potential may be supplied from an external terminal arranged in the through-hole H2 to the second electrode 515 through the through-hole H2, the wiring 522CB of the readout circuit substrate 520, and the conductive film 515B. As a result of the photoelectric conversion in the photoelectric conversion layer 513, the signal voltage read out from the first electrode 511 may be read out to a readout circuit of the semiconductor substrate 521 through the contact electrodes 519E and 522E, and outputted to an external terminal arranged in the through-hole H2 through the readout circuit. The signal voltage may be outputted to an external terminal, for example, through the other circuits included in the readout circuit substrate 520, together with the readout circuit. The other circuits are, for example, a signal processing circuit and an output circuit.

The readout circuit substrate 520 is preferably thicker than the element substrate 510. For example, the readout circuit substrate 520 is preferably thicker than the element substrate 510 by a factor of 2 or more, preferably by a factor of 5 or more, or more preferably by a factor of 10 or more. Alternatively, the thickness of the readout circuit substrate 520 is, for example, 100 μm or more, 150 μm or more, or 200 μm or more. The readout circuit substrate 520 having such a large thickness secures the mechanical strength of the light receiving element 501. Note that the readout circuit substrate 520 may include only one semiconductor substrate 521 for forming a circuit, or may further include a substrate such as a support substrate in addition to the semiconductor substrate 521 for forming a circuit.

FIG. 19 is a diagram illustrating a cross-sectional configuration of another light receiving element. For example, each of the pixel circuits 1 described in each embodiment and each modification example can be applied to the light receiving element illustrated in FIG. 19.

In FIG. 19, each pixel 602 in the pixel array region is divided into a normal pixel 602A or a charge discharging pixel 602B depending on the difference in the control of the reset transistor, but since both the normal pixel 602A and the charge discharging pixel 602B have the same pixel structure, the pixel structure is simply described as a pixel 602. Note that the charge discharging pixel 602B is arranged on the outermost side of the pixel array region.

A capacitive element, a reset transistor, an amplifier transistor, and a readout circuit for a select transistor in each pixel 602 are formed for each pixel on a semiconductor substrate 612 made of, for example, a single-crystal material such as single-crystal silicon (Si).

On the upper side of the semiconductor substrate 612, which is on the light incident side, an N-type semiconductor thin film 641 is formed on the entire surface of the pixel array region. The N-type semiconductor thin film 641 is made of a compound semiconductor having InGaP, InAlP, InGaAs, InAlAs, or a chalcopyrite structure. A compound semiconductor having a chalcopyrite structure is a material capable of obtaining a high optical absorption coefficient and high sensitivity over a wide wavelength range, and is preferably used for the N-type semiconductor thin film 641 for photoelectric conversion. Such a compound semiconductor having a chalcopyrite structure is composed of the elements around group IV elements, such as Cu, Al, Ga, In, S, and Se; examples of these elements include CuGaInS-based mixed crystal, CuAlGaInS-based mixed crystal, and CuAlGaInSSe-based mixed crystal. The pixel circuit 1 described in each embodiment and each modification example can be applied to a readout circuit arranged on the semiconductor substrate 612.

In addition to the above-described compound semiconductor, for example, amorphous silicon (Si), germanium (Ge), a quantum dot photoelectric conversion film, an organic photoelectric conversion film may be used for the material of the N-type semiconductor thin film 641. Here, an InGaAs compound semiconductor can be used for the N-type semiconductor thin film 641.

On the lower side of the N-type semiconductor thin film 641 on the semiconductor substrate 612 side, a high-concentration P-type layer 642 constituting a pixel electrode is formed for each pixel. Between the high-concentration P-type layers 642 formed for each pixel, an N-type layer 643 as a pixel separation region for separating each pixel 602 is formed of a compound semiconductor such as InP, for example. The N-type layer 643 serves not only as a pixel separation region but also as a dark current prevention region.

On the other hand, an N-type layer 644 having a higher concentration than that of the N-type semiconductor thin film 641 is also formed on the upper side of the N-type semiconductor thin film 641 on the light incident side by using a compound semiconductor such as InP used as a pixel separation region. The high-concentration N-type layer 644 functions as a barrier layer for preventing the reverse flow of charges generated in the N-type semiconductor thin film 641. A compound semiconductor such as InGaAs, InP, or InAlAs can be used for the material of the high-concentration N-type layer 644.

An antireflection film 645 is formed on the high-concentration N-type layer 644 as a barrier layer. For example, silicon nitride (SiN), hafnium oxide ($HfO_2$), aluminum oxide ($Al_2O_3$), zirconium oxide ($ZrO_2$), tantalum oxide ($Ta_2Ta_5$), titanium oxide ($TiO_2$) can be used for the material of the antireflection film 645.

Either the high-concentration N-type layer 644 or the antireflection film 645 functions as an upper electrode on the upper side among the electrodes sandwiching the N-type semiconductor thin film 641 vertically, and a predetermined voltage Va is applied to the high-concentration N-type layer 644 or the antireflection film 645 as an upper electrode.

A color filter 646 and an on-chip lens 647 are further formed on the antireflection film 645. The color filter 646 is a filter that transmits any one of red (R), green (G), and blue (B) light (wavelength light), and is arranged in, for example, a so-called Bayer array in the pixel array region.

A passivation layer 651 and an insulating layer 652 are formed below the high-concentration P-type layer 642 constituting a pixel electrode and the N-type layer 643 as a pixel separation region. Connection electrodes 653A and 653B and bump electrodes 654 are formed so as to penetrate through the passivation layer 651 and the insulating layer 652. The connection electrodes 653A and 653B and the bump electrode 654 electrically connect the high-concentration P-type layer 642 constituting the pixel electrode to a capacitive element 622 for accumulating charges.

The normal pixel 602A and the charge discharging pixel 602B are configured as described above, and have the same pixel structure. However, the control method of the reset transistor is different between the normal pixel 602A and the charge discharging pixel 602B.

In the normal pixel 602A, the reset transistor is turned on and off based on the reset signal in accordance with, for example, a charge generation period (light receiving period) by the photoelectric conversion unit and a reset period of the potential of the capacitive element before the start of light reception, while in the charge discharging pixel 602B, the reset transistor is always turned on. Thus, the charges generated in the photoelectric conversion unit are discharged to the ground, and a constant voltage Va is always applied to the charge discharging pixel 602B.

3. Application to Mobile Body

The technique according to the present disclosure (the present technique) can be applied to various products. For example, the technique according to the present disclosure may be implemented as devices mounted on any kind of mobile body, such as an automobile, an electric vehicle, a hybrid electric vehicle, a motorcycle, a bicycle, a personal mobility, an airplane, a drone, a ship, or a robot.

Figure 20:
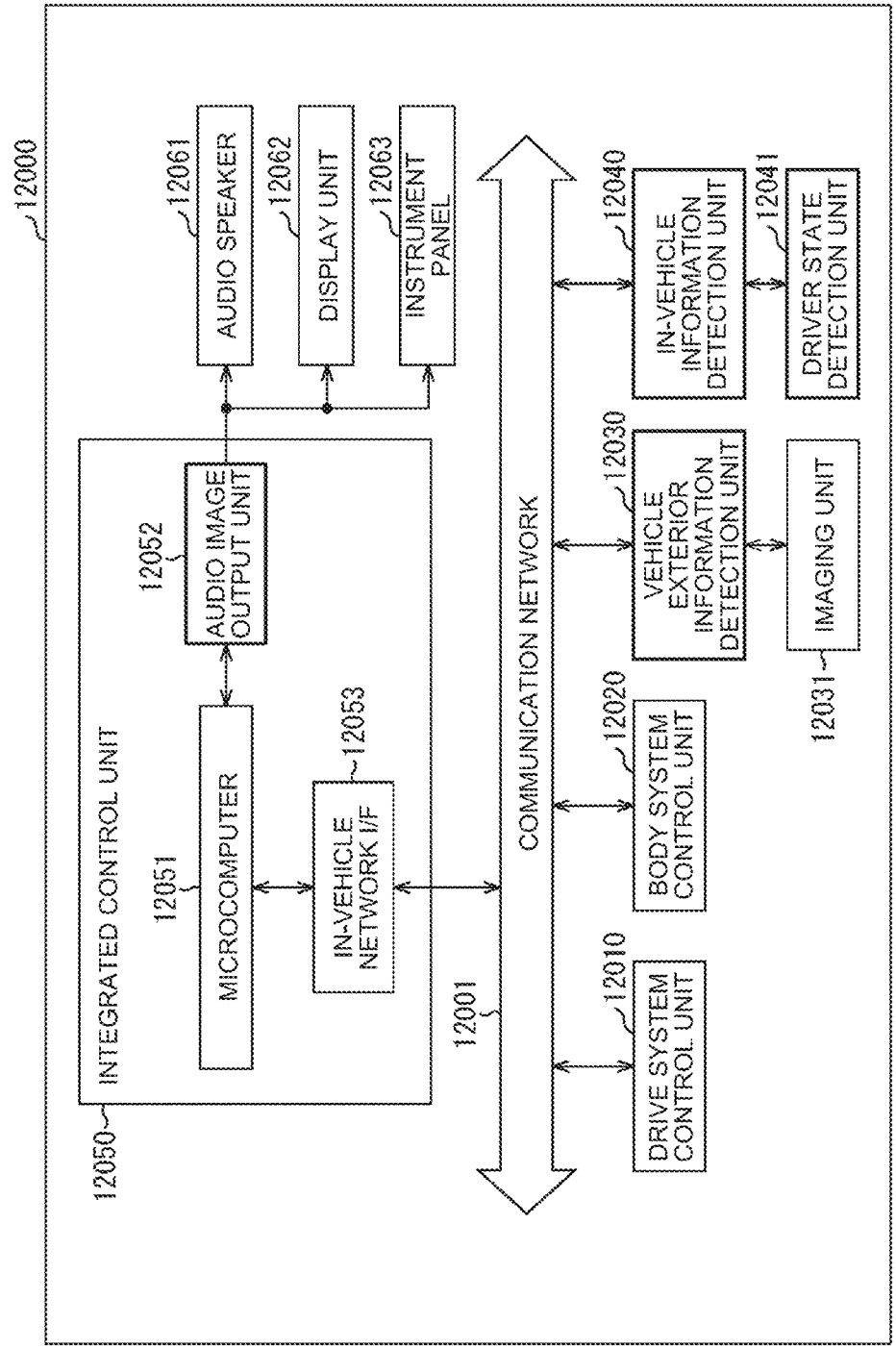
FIG. 20 is a block diagram illustrating an example of a schematic configuration of a vehicle control system.

FIG. 20 is a block diagram illustrating a schematic configuration example of a vehicle control system that is an example of a mobile control system to which the technique according to the present disclosure can be applied.

A vehicle control system 12000 includes a plurality of electronic control units connected via a communication network 12001. In the example illustrated in FIG. 20, the vehicle control system 12000 includes a drive system control unit 12010, a body system control unit 12020, a vehicle exterior information detection unit 12030, an in-vehicle information detection unit 12040, and an integrated control unit 12050. In addition, as a functional configuration of the integrated control unit 12050, a microcomputer 12051, an audio image output unit 12052, and an in-vehicle network I/F (interface) 12053 are illustrated.

The drive system control unit 12010 controls the operation of the devices related to the drive system of the vehicle according to various programs. For example, the drive system control unit 12010 functions as a driving force generation device for generating a driving force of a vehicle such as an internal combustion engine or a driving motor, a driving force transmission mechanism for transmitting the driving force to wheels, and a steering mechanism for regulating the steering angle of the vehicle, and a control device such as a braking device for generating a braking force of the vehicle.

The body system control unit 12020 controls the operation of various devices mounted on the vehicle body according to various programs. For example, the body system control unit 12020 functions as a keyless entry system, a smart key system, a power window device, or a control device for various lamps such as headlamps, rear lamps, brake lamps, blinkers, or fog lamps. In this case, the body system control unit 12020 can receive radio waves transmitted from a portable device that substitutes for a key, or signals from various switches. The body system control unit 12020 receives input of these radio waves or signals, and controls a door lock device, a power window device, lamps, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the captured image. The vehicle exterior information detection unit 12030 may perform object detection processing of a person, a car, an obstacle, a sign, or characters on a road surface, or distance detection processing, in accordance with the received image.

The imaging unit 12031 is an optical sensor that receives light and outputs an electrical signal corresponding to the amount of received light. The imaging unit 12031 can output an electrical signal as an image or as distance measurement information. In addition, the light received by the imaging unit 12031 may be visible light or invisible light such as infrared rays.

The in-vehicle information detection unit 12040 detects vehicle interior information. For example, a driver state detection unit 12041 that detects the state of the driver is connected to the in-vehicle information detection unit 12040. The driver state detection unit 12041 includes, for example, a camera that images the driver, and the in-vehicle information detection unit 12040 may calculate, in accordance with the detected information input from the driver state detection unit 12041, the degree of tiredness or concentration of the driver or determine whether the driver is asleep.

A microcomputer 12051 is able to calculate a control target value of the driving force generation device, the steering mechanism, or the braking device, on the basis of the information inside and outside the vehicle acquired by the vehicle exterior information detection unit 12030 or the in-vehicle information detection unit 12040, to output a control command to the drive system control unit 12010. For example, the microcomputer 12051 can perform cooperative control for the purpose of implementing advanced driver assistance system (ADAS) functions including vehicle collision avoidance or impact mitigation, tracking based on inter-vehicle distance, vehicle speed maintenance, vehicle collision warning, or vehicle lane departure warning.

In addition, the microcomputer 12051 can also perform cooperative control for the purpose of automatic driving to travel the vehicle autonomously without relying on the operation control of the driver by controlling the driving force generation device, the steering mechanism, the braking device, and so on in accordance with the information around the vehicle acquired by the vehicle exterior information detection unit 12030 or the in-vehicle information detection unit 12040.

The microcomputer 12051 can output a control command to the body system control unit 12020 on the basis of the information outside the vehicle acquired by the vehicle exterior information detection unit 12030. For example, the microcomputer 12051 controls the headlamps according to the position of the preceding vehicle or oncoming vehicle detected by the vehicle exterior information detection unit 12030, and performs cooperative control for the purpose of anti-glare, such as switching a high beam to a low beam.

The audio image output unit 12052 transmits an output signal of at least one of audio and image to an output device capable of visually or audibly notifying information to a vehicle occupant or the outside of the vehicle. In the example of FIG. 20, an audio speaker 12061, a display unit 12062, and an instrument panel 12063 are illustrated as output devices. The display unit 12062 may include at least one of an on-board display and a head-up display, for example.

Figure 21:
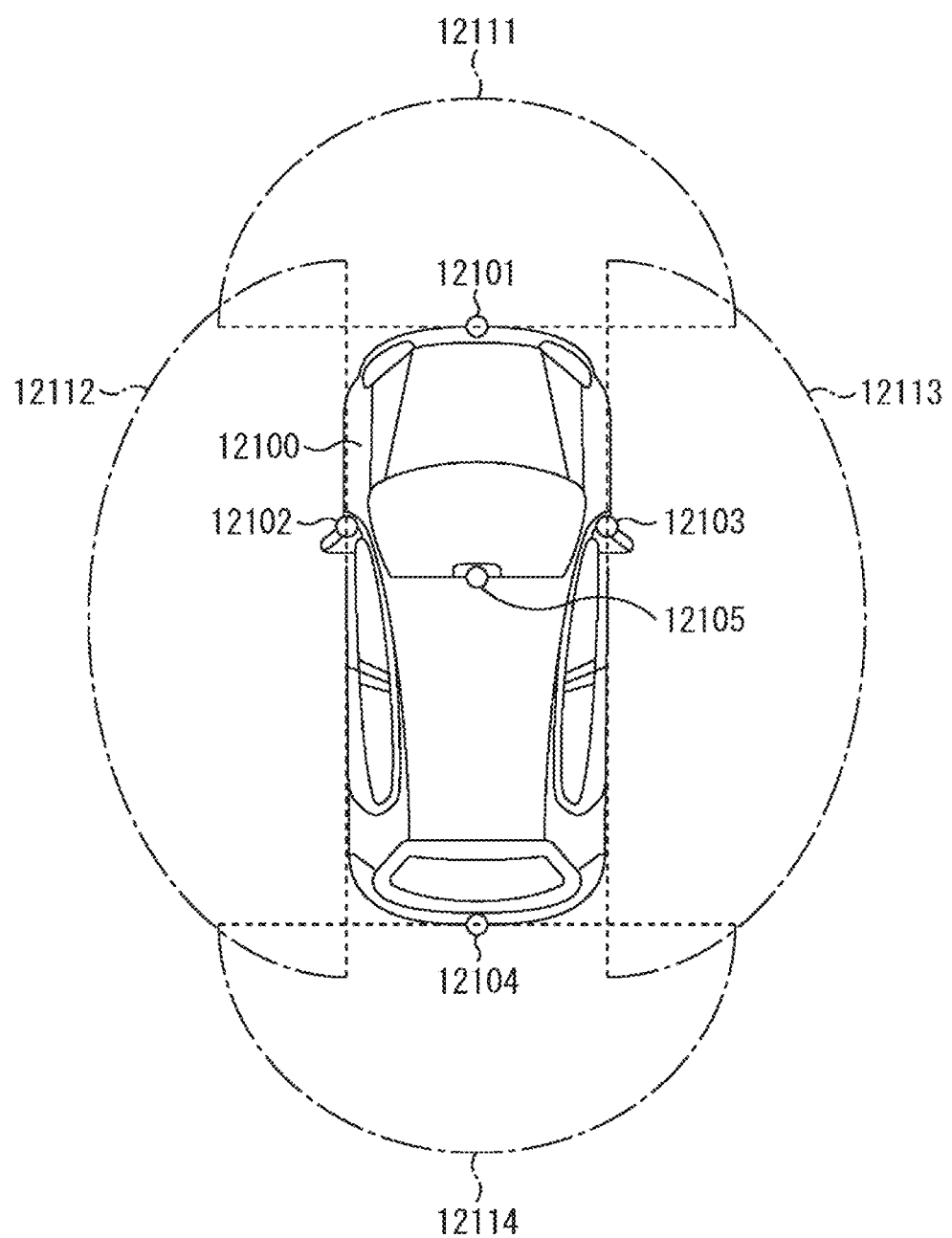
FIG. 21 is an explanatory diagram illustrating an example of installation positions of a vehicle exterior information detection unit and an imaging unit.

FIG. 21 is a diagram illustrating an example of installation positions of the imaging unit 12031.

In FIG. 21, a vehicle 12100 has imaging units 12101, 12102, 12103, 12104, and 12105 as the imaging unit 12031.

The imaging units 12101, 12102, 12103, 12104, and 12105 are provided, for example, at positions including a front nose, a side mirror, a rear bumper, a rear door, and an upper portion of a windshield in the vehicle interior of the vehicle 12100. The imaging unit 12101 provided at the front nose and the imaging unit 12105 provided at the upper part of the windshield in the vehicle interior mainly acquire an image in front of the vehicle 12100. The imaging units 12102 and 12103 provided at the side mirrors mainly acquire images of the side of the vehicle 12100. The imaging unit 12104 provided at the rear bumper or the rear door mainly acquires an image behind the vehicle 12100. The front images acquired by the imaging units 12101 and 12105 are mainly used for detecting a preceding vehicle, a pedestrian, an obstacle, a traffic light, a traffic sign, or a lane, for example.

Figure 22:
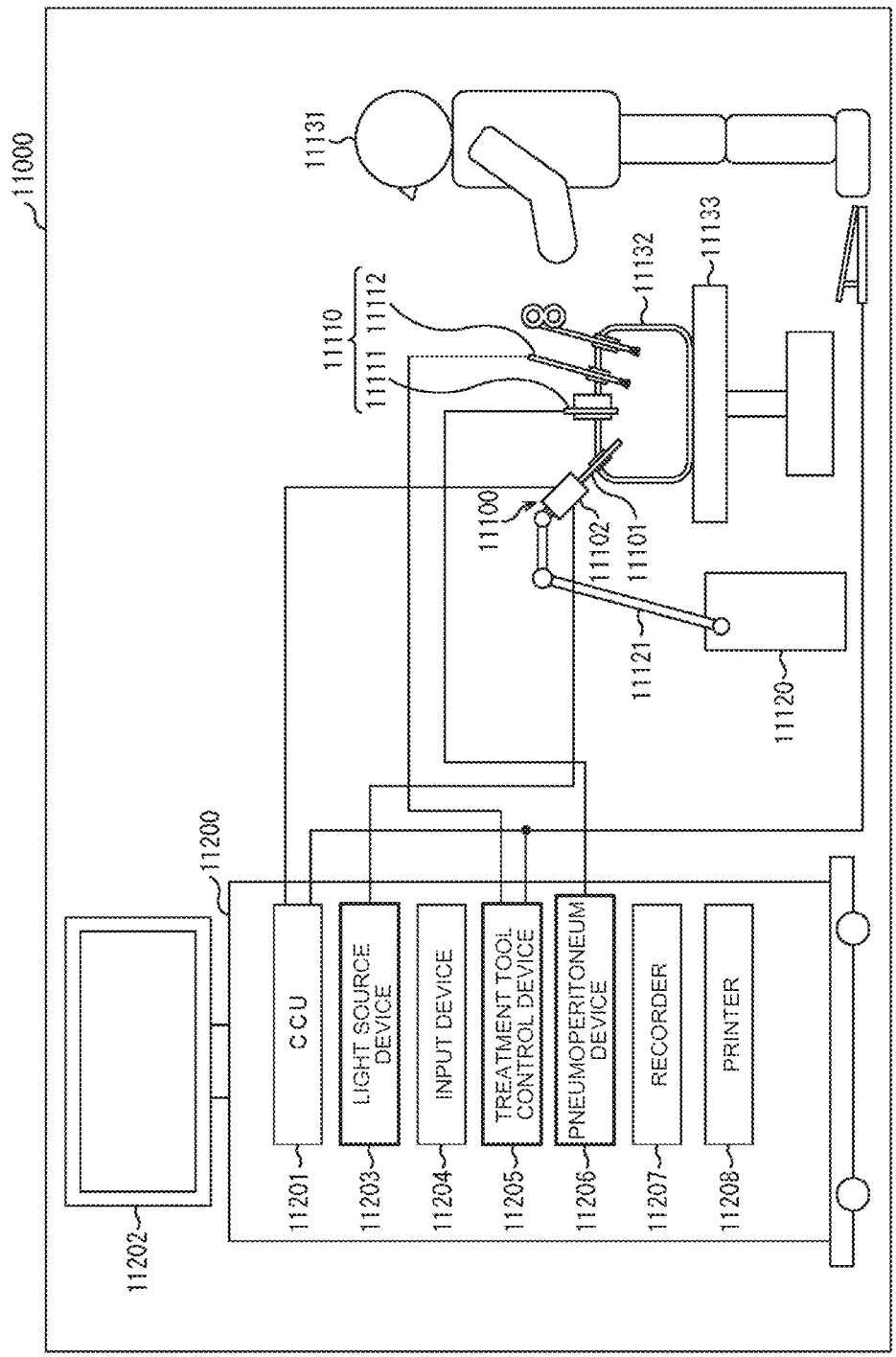
FIG. 22 is a diagram illustrating an example of a schematic configuration of an endoscopic surgery system.

Note that FIG. 22 illustrates an example of the imaging range of the imaging units 12101 to 12104. An imaging range 12111 indicates the imaging range of the imaging unit 12101 provided at the front nose, imaging ranges 12112 and 12113 indicate the imaging ranges of the imaging units 12102 and 12103 provided at the side mirrors, and an imaging range 12114 indicates the imaging range of the imaging unit 12104 provided at the rear bumper or the rear door. For example, by superimposing the image data captured by the imaging units 12101 to 12104, an overhead image when the vehicle 12100 is viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 uses the distance information obtained from the imaging units 12101 to 12104 to determine the distance to a three-dimensional object in the imaging ranges 12111 to 12114 and the temporal change of the distance (relative speed with respect to the vehicle 12100), whereby it is possible to extract, particularly as a preceding vehicle, the closest three-dimensional object on the traveling path of the vehicle 12100 and the three-dimensional object that travels at a predetermined speed (e.g., 0 km/h or more) in substantially the same direction as the vehicle 12100. Further, the microcomputer 12051 can set an inter-vehicle distance to be secured in advance before the preceding vehicle, and can perform automatic brake control (including follow-up stop control), automatic acceleration control (including follow-up start control), and the like. Thus, it is possible to perform the cooperative control for the purpose of automatic driving or the like to travel autonomously without relying on the operation of the driver.

For example, the microcomputer 12051 can classify three-dimensional object data related to the three-dimensional object, on the basis of the distance information obtained from the imaging units 12101 to 12104, extracts the three-dimensional objects such as two-wheeled vehicles, ordinary vehicles, large vehicles, pedestrians, power poles, or the like, and uses the extracted data for automatic avoidance of obstacles. For example, the microcomputer 12051 distinguishes obstacles around the vehicle 12100 between obstacles visible to the driver of the vehicle 12100 and obstacles difficult to recognize visually. The microcomputer 12051 determines the collision risk indicating the risk of collision with each obstacle and, if the collision risk is equal to or exceeds a setting value and indicates the possibility of collision, the microcomputer 12051 can assist driving to avoid collision by outputting an alarm to the driver via the audio speaker 12061 or the display unit 12062, or executing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether a pedestrian is present in the captured images of the imaging units 12101 to 12104. Such pedestrian recognition is carried out, for example, by determining whether a person is a pedestrian by performing a pattern matching process on a sequence of feature points indicating a contour of the object and a procedure for extracting feature points in the captured images of the imaging units 12101 to 12104 as infrared cameras. When the microcomputer 12051 determines that a pedestrian exists in the captured images of the imaging units 12101 to 12104 and recognizes the pedestrian, the audio image output unit 12052 controls the display unit 12062 to superimpose and display a rectangular contour line for emphasizing the recognized pedestrian. Further, the audio image output unit 12052 may control the display unit 12062 so as to display an icon or the like indicating a pedestrian at a desired position.

As above, an example of a vehicle control system to which the technique according to the present disclosure can be applied has been described. The technique according to the present disclosure can be applied to the imaging unit 12031 among the configurations described above. Specifically, the pixel 120 having the pixel circuit 1 illustrated in FIGS. 3 and 11 to 14 can be applied to the imaging unit 12031. Applying the technique according to the present disclosure to the imaging unit 12031 enables a wide dynamic range to be secured, the risk of characteristic variations to be suppressed, and a more easily viewable photographed image to be obtained, so that the fatigue of the driver can be reduced.

4. Application to Endoscopic Surgery System

The technique according to the present disclosure may also be applied to an endoscopic surgery system.

FIG. 22 is a diagram illustrating an example of a schematic configuration of an endoscopic surgery system to which the technique according to the present disclosure (the present technique) can be applied.

FIG. 22 illustrates a situation where an operator (doctor) 11131 is performing a surgery on a patient 11132 on a patient bed 11133 using the endoscopic surgery system 11000. As illustrated in the figure, the endoscopic surgery system 11000 includes an endoscope 11100, other surgical tools 11110 such as a pneumoperitoneum tube 11111 and an energy treatment tool 11112, a support arm device 11120 for supporting the endoscope 11100, and a cart 11200 equipped with various devices for endoscopic surgery.

The endoscope 11100 includes the lens barrel 11101 having a region of a predetermined length from a distal end inserted into the body cavity of the patient 11132, and a camera head 11102 connected to a proximal end of the lens barrel 11101. In the illustrated example, the endoscope 11100 configured as a so-called rigid endoscope having a hard lens barrel 11101 is illustrated, but the endoscope 11100 may be configured as a so-called flexible endoscope having a soft lens barrel.

An aperture into which the objective lens is fitted is provided at the distal end of the lens barrel 11101. A light source device 11203 is connected to the endoscope 11100, and light generated by the light source device 11203 is guided to the distal end of the lens barrel by a light guide extending inside the lens barrel 11101, and is directed toward an observation target in the body cavity of the patient 11132 through the objective lens. Note that the endoscope 11100 may correspond to a direct-view endoscope, a perspective-view endoscope, or a side-view endoscope.

An optical system and an imaging element are provided inside the camera head 11102, and the reflected light (observation light) from the observation target is focused on the imaging element by the optical system. The observation light is photoelectrically converted by the imaging element, and an electric signal corresponding to the observation light, that is, an image signal corresponding to the observation image is generated. The image signal is transmitted to a camera control unit (CCU) 11201 as RAW data.

The CCU 11201 includes a central processing unit (CPU), a graphics processing unit (GPU) etc., and controls operations of the endoscope 11100 and the display device 11202 in an integrated manner. Further, the CCU 11201 receives an image signal from the camera head 11102 and performs various types of image processing for displaying an image based on the image signal, such as development processing (demosaic processing), on the image signal.

The display device 11202 displays an image based on the image signal subjected to image processing by the CCU 11201 under the control of the CCU 11201.

The light source device 11203 includes, for example, a light source such as a light emitting diode (LED), and supplies the endoscope 11100 with irradiation light when imaging, for instance, the surgical site.

The input device 11204 is an input interface to the endoscopic surgery system 11000. The user can input various types of information and input instructions to the endoscopic surgery system 11000 via the input device 11204. For example, the user inputs instructions to change an imaging condition (for instance, type of irradiation light, magnification, and focal length) by the endoscope 11100.

A treatment tool control device 11205 controls driving of an energy treatment tool 11112 for cauterization and incision of tissue, sealing of a blood vessel, etc. A pneumoperitoneum device 11206 sends gas into the body cavity via the pneumoperitoneum tube 11111 to inflate the body cavity of the patient 11132 in order to ensure a visual field by the endoscope 11100 and ensure a working space of the operator. A recorder 11207 is a device that can record various types of information related to surgery. A printer 11208 is a device capable of printing various types of information related to surgery in various formats such as text, an image, a graph, etc.

Note that the light source device 11203 for supplying irradiation light to the endoscope 11100 at the time of photographing the surgical site may be constituted by a white light source composed of, for example, an LED, a laser light source, or a combination thereof. When the white light source is configured by a combination of RGB laser light sources, the output intensity and output timing of each color (each wavelength) can be controlled with high accuracy, and thus the light source device 11203 can adjust white balance of a captured image. In addition, in this case, the laser light from each of the RGB laser light sources is emitted to the observation target in a time-division manner, and driving of the imaging element of the camera head 11102 is controlled in synchronization with the irradiation timing, whereby the image corresponding to each of RGB can be captured in a time-division manner. According to this method, a color image can be obtained without providing a color filter in the imaging element.

In addition, the driving of the light source device 11203 may be controlled to change the intensity of light to be output at predetermined intervals. By controlling driving of the imaging element of the camera head 11102 in synchronization with the timing of the change of the light intensity to acquire an image in a time-division manner, and synthesizing the image, it is possible to generate an image in a high dynamic range without so-called underexposure and overexposure.

Further, the light source device 11203 may be configured to be able to supply light in a predetermined wavelength band corresponding to special light observation. In special light observation, for example, wavelength dependence of light absorption in body tissue is used to irradiate light in a narrower band than that of irradiation light during normal observation (that is, white light), thereby performing so-called narrow band imaging for imaging predetermined tissue such as a blood vessel on a mucosal surface at high contrast. Alternatively, in special light observation, a fluorescence observation for obtaining an image by fluorescence generated by irradiating excitation light may be performed. In fluorescence observation, body tissue may be irradiated with excitation light and fluorescence from the body tissue may be observed (autofluorescence observation), or a reagent such as indocyanine green (ICG) may be locally injected into body tissue and the body tissue may be irradiated with excitation light corresponding to a fluorescence wavelength of the reagent to obtain a fluorescence image. The light source device 11203 can be configured to be able to supply narrowband light and/or excitation light corresponding to such special light observation.

Figure 23:
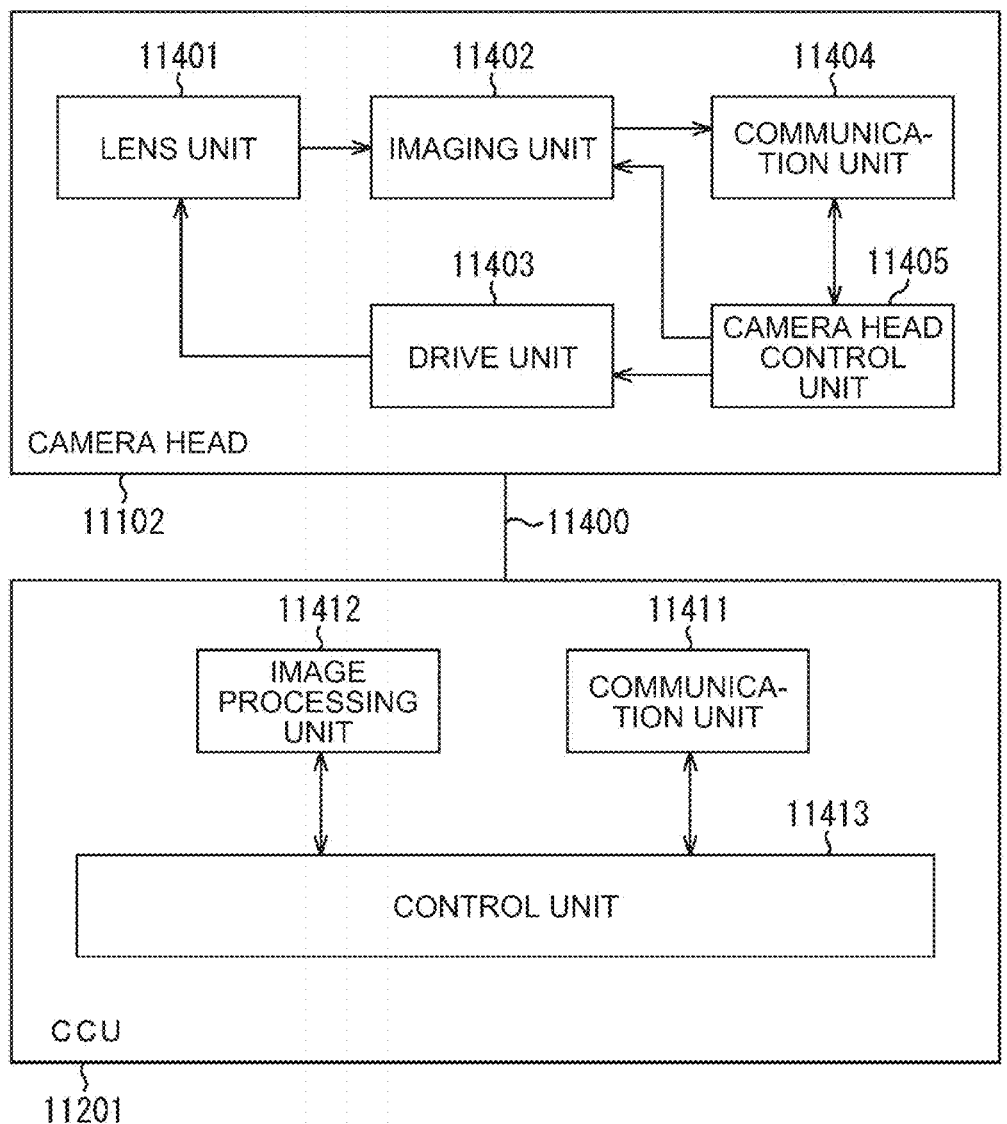
FIG. 23 is a block diagram illustrating an example of a functional configuration of a camera head and a CCU.

FIG. 23 is a block diagram illustrating an example of a functional configuration of the camera head 11102 and the CCU 11201 illustrated in FIG. 22.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are mutually communicably connected by a transmission cable 11400.

The lens unit 11401 is an optical system provided at a portion connected to the lens barrel 11101. Observation light taken in from the distal end of the lens barrel 11101 is guided to the camera head 11102 and enters the lens unit 11401. The lens unit 11401 is configured by combining a plurality of lenses including a zoom lens and a focus lens.

The imaging unit 11402 includes an imaging element. The number of imaging elements included in the imaging unit 11402 may be one (so-called single plate system) or multiple (so-called multi-plate system). In the case where the imaging unit 11402 is constituted of a multi-plate system, for example, image signals corresponding to RGB may be generated by each imaging element, and these signals may be combined to obtain a color image. Alternatively, the imaging unit 11402 may be configured to include a pair of imaging elements for acquiring respective image righteye and left-eye image signals corresponding to three-dimensional (3D) display. When 3D display is performed, the operator 11131 can more accurately comprehend a depth of living tissue at a surgical site. When the imaging unit 11402 is configured as a multi-plate system, a plurality of lens units 11401 may be provided corresponding to respective imaging elements.

In addition, the imaging unit 11402 may not necessarily be provided in the camera head 11102. For example, the imaging unit 11402 may be provided inside the lens barrel 11101 immediately behind the objective lens.

The drive unit 11403 includes an actuator, and moves the zoom lens and the focus lens of the lens unit 11401 by a predetermined distance along the optical axis under the control of the camera head control unit 11405. Thus, the magnification and the focus of the image captured by the imaging unit 11402 can be appropriately adjusted.

The communication unit 11404 includes a communication device for transmitting and receiving various types of information to and from the CCU 11201. The communication unit 11404 transmits the image signal obtained from the imaging unit 11402 as RAW data to the CCU 11201 via the transmission cable 11400.

In addition, the communication unit 11404 receives a control signal for controlling the driving of the camera head 11102 from the CCU 11201 and supplies the control signal to the camera head control unit 11405. The control signal includes, for example, information related to the imaging condition such as information for specifying a frame rate of the captured image, information for specifying an exposure value at the time of imaging, and/or information for specifying the magnification and focus of the captured image.

Note that the above-described imaging conditions such as the frame rate, the exposure value, the magnification, and the focus may be appropriately specified by the user, or may be automatically set by the control unit 11413 of the CCU 11201 based on the acquired image signal. In the latter case, a so-called auto exposure (AE) function, an auto focus (AF) function and an auto white balance (AWB) function are mounted on the endoscope 11100.

The camera head control unit 11405 controls the driving of the camera head 11102 based on a control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

In addition, the communication unit 11411 transmits a control signal for controlling driving of the camera head 11102 to the camera head 11102. The image signal and the control signal can be transmitted by electric communication or optical communication.

The image processing unit 11412 performs various types of image processing on an image signal that is RAW data transmitted from the camera head 11102.

The control unit 11413 performs various controls related to the imaging of the surgical site or the like by the endoscope 11100 and the display of the captured image obtained by the imaging of the surgical site or the like. For example, the control unit 11413 generates a control signal for controlling the driving of the camera head 11102.

In addition, the control unit 11413 causes the display device 11202 to display a captured image of the surgical site or the like based on an image signal subjected to image processing by the image processing unit 11412. In this instance, the control unit 11413 may recognize various objects in the captured image using various image recognition technologies. For example, the control unit 11413 can recognize a surgical tool such as forceps, a specific living body part, bleeding, and mist at the time of using the energy treatment tool 11112 by detecting, for instance, a shape, a color of an edge of an object included in the captured image. When the captured image is displayed on the display device 11202, the control unit 11413 may use a recognition result to superimpose and display various types of operation support information on the image of the surgical site. When the operation support information is superimposed and displayed to be presented to the operator 11131, the burden on the operator 11131 can be reduced and the surgery by the operator 11131 can be performed more safely and reliably.

The transmission cable 11400 connecting the camera head 11102 and the CCU 11201 to each other is an electric signal cable corresponding to electric signal communication, an optical fiber corresponding to optical communication, or a composite cable thereof.

Here, in the illustrated example, the communication is performed by wire using the transmission cable 11400, but the communication between the camera head 11102 and the CCU 11201 may be performed wirelessly.

As above, an example of the endoscopic surgery system to which the technique according to the present disclosure can be applied has been described above. The technique according to the present disclosure can be applied to the endoscope 11100 and the imaging unit 11402 of the camera head 11102 among the configurations described above. Specifically, the pixel 120 having the pixel circuit 1 illustrated in FIGS. 3 and 11 to 14 can be applied to the endoscope 11100 and the imaging unit 11402 of the camera head 11102. Applying the technique according to the present disclosure to the endoscope 11100 and the imaging unit 11402 of the camera head 11102 enables a wide dynamic range to be secured, the risk of characteristic variations to be suppressed, and a clearer image of a surgical site to be obtained, so that the operator can accurately confirm the surgical site.

Although the endoscopic surgery system has been described herein as an example, the technique according to the present disclosure may be applied to, for example, a microscopic surgery system.

While the embodiments of the present disclosure have been described above, the technical scope of the present disclosure is not limited to the embodiments described above as they are, and various modifications may be made without departing from the gist of the present disclosure. Components spanning different embodiments and variations may also be combined as appropriate.

The effects described herein are merely examples and not limited thereto, and other effects may be provided.

Note that the present technique can also have the following configurations.

(1)
A light detecting device comprising:
a photoelectric conversion region configured to generate a photoelectric charge;
a sense node, wherein the sense node is connected to the photoelectric conversion region, includes a first capacitive element, and holds the photoelectric charge generated by the photoelectric conversion region;
a floating diffusion configured to hold the photoelectric charge transferred from the sense node;
a first transistor between the sense node and the floating diffusion, wherein the first transistor is configured to selectively connect the sense node to the floating diffusion to transfer the photoelectric charge held in the sense node to the floating diffusion; and
a second transistor between the floating diffusion and a signal line, wherein the second transistor is configured to selectively cause a pixel signal of a voltage value corresponding to a charge amount of the photoelectric charge held in the floating diffusion to appear on the signal line.

(2)
The light detecting device according to (1), wherein a first capacitance of the sense node approximates a second capacitance of the floating diffusion.

(3)
The light detecting device according to (1) or (2), wherein a capacitance of the first capacitive element is 10 fF (femtofarad) or more.

(4)
The light detecting device according to any one of (1) to (3), wherein the floating diffusion includes a second capacitive element.

(5)
The light detecting device according to (4), wherein a capacitance of the first capacitive element is smaller than a capacitance of the second capacitive element.

(6)
The light detecting device according to (4) or (5), wherein an occupied area of the first capacitive element is less than an occupied area of the second capacitive element.

(7)
The light detecting device according to any one of (4) to (6), wherein the first capacitive element is arranged near the first transistor, and the second capacitive element is arranged at a position other than a position where the first transistor, the second transistor, and the first capacitive element are arranged.

(8)
The light detecting device according to any one of (4) to (7), wherein a shielding member that shields the first capacitive element and the second capacitive element is arranged between the first capacitive element and the second capacitive element.

(9)
The light detecting device according to any one of (1) to (8), wherein the first capacitive element includes any one of a metal oxide semiconductor (MOS) capacitor, a capacitor having a metal insulator metal (MIM) structure in which an insulator is sandwiched by metals, and a capacitor having a three-dimensional MIM structure.

(10)
The light detecting device according to any one of (4) to (9), wherein the second capacitive element includes any one of a metal oxide semiconductor (MOS) capacitor, a capacitor having a metal insulator metal (MIM) structure in which an insulator is sandwiched by metals, and a capacitor having a three-dimensional MIM structure.

(11)
The light detecting device according to any one of (1) to (10), further comprising: a third transistor arranged on a wiring connecting the floating diffusion and a constant voltage source to discharge the photoelectric charge held by the floating diffusion to the constant voltage source; and
a fourth transistor arranged on a wiring connecting the second transistor and the signal line to switch the connection between the second transistor and the signal line.

(12)
The light detecting device according to any one of (1) to (11), further comprising a fifth transistor arranged on a wiring connecting the sense node and the constant voltage source to discharge the photoelectric charge held by the sense node to the constant voltage source.

(13)
The light detecting device according to any one of (1) to (12), wherein the photoelectric conversion region includes any one of indium gallium arsenide (InGaAs), indium arsenide antimonide (InAsSb), indium arsenide (InAs), indium antimonide (InSb), mercury cadmium tellurium (HgCdTe), germanium (Ge), a quantum dot, or an organic compound.

(14)
The light detecting device according to any one of (1) to (13), wherein an electrode connected to the photoelectric conversion region and an electrode connected to the sense node are directly bonded and electrically conductive.

(15)
The light detecting device according to any one of (1) to (14), wherein a terminal connected to the photoelectric conversion region and a terminal connected to the sense node are connected by a bump electrode and electrically conductive.

(16)
The light detecting device according to (4), wherein at least a portion of the first capacitive element and at least a portion of the second capacitive element are formed by a first wiring layer.

(17)
The light detecting device according to (16), wherein the first wiring layer is disposed between the photoelectric conversion region and the sense node.

(18)
The light detecting device according to (16), wherein the first capacitive element and the second capacitive element are connected to a first voltage source.

(19)
The light detecting device according to any one of (1) to (15), wherein the photoelectric conversion region has a p-type impurity region connected to the sense node.

(20)
An electronic device, comprising:
a pixel array in which a plurality of pixels are arranged in row and column directions;
a drive circuit configured to drive pixels to be read out in the plurality of pixels; and
a processing circuit configured to read out pixel signals from the pixels to be read out which are driven by the drive circuit,
wherein each of the plurality of pixels includes:
a photoelectric conversion region configured to generate a photoelectric charge;
a sense node that includes a first capacitive element and that holds the photoelectric charge generated by the photoelectric conversion region;
a floating diffusion that includes a second capacitive element and that holds the photoelectric charge transferred from the first charge holding unit;
a first transistor arranged between the sense node and the floating diffusion, wherein the first transistor is configured to selectively transfer the photoelectric charge held in the sense node to the floating diffusion; and
a second transistor between the floating diffusion and a signal line, wherein the second transistor is configured to selectively cause a pixel signal of a voltage value corresponding to a charge amount of the photoelectric charge held in the second charge holding unit to appear on the signal line.

(21)
A solid-state imaging device comprising:
a photoelectric conversion unit configured to generate a photoelectric charge;
a first charge holding unit that includes a first capacitive element and holds the photoelectric charge generated by the photoelectric conversion unit;
a second charge holding unit configured to hold the photoelectric charge transferred from the first charge holding unit;
a first transistor arranged on a wiring connecting the first charge holding unit and the second charge holding unit to transfer the photoelectric charge held in the first charge holding unit to the second charge holding unit; and
a second transistor configured to cause a pixel signal of a voltage value corresponding to a charge amount of the photoelectric charge held in the second charge holding unit to appear on a signal line.

(22)
The solid-state imaging device according to (21), wherein first capacitance of the first charge holding unit approximates second capacitance of the second charge holding unit.

(23)
The solid-state imaging device according to (21) or (22), wherein capacitance of the first capacitive element is 10 fF (femtofarad) or more.

(24)
The solid-state imaging device according to any one of (21) to (23), wherein the second charge holding unit includes a second capacitive element.

(25)
The solid-state imaging device according to (24), wherein the capacitance of the first capacitive element is smaller than capacitance of the second capacitive element.

(26)
The solid-state imaging device according to (24) or (25), wherein an occupied area of the first capacitive element is smaller than an occupied area of the second capacitive element.

(27)
The solid-state imaging device according to any one of (24) to (26), wherein the first capacitive element is arranged near the first transistor, and the second capacitive element is arranged at a position other than a position where the first transistor, the second transistor, and the first capacitive element are arranged.

(28)
The solid-state imaging device according to any one of (24) to (27), wherein a shielding member that shields the first capacitive element and the second capacitive element is arranged between the first capacitive element and the second capacitive element.

(29)
The solid-state imaging device according to any one of (21) to (28), wherein the first capacitive element includes any one of a metal oxide semiconductor (MOS) capacitor, a capacitor having a metal insulator metal (MIM) structure in which an insulator is sandwiched by metals, and a capacitor having a three-dimensional MIM structure.

(30)
The solid-state imaging device according to any one of (24) to (29), wherein the second capacitive element includes any one of a metal oxide semiconductor (MOS) capacitor, a capacitor having a metal insulator metal (MIM) structure in which an insulator is sandwiched by metals, and a capacitor having a three-dimensional MIM structure.

(31)
The solid-state imaging device according to any one of (21) to (30), further comprising:
a third transistor arranged on a wiring connecting the second charge holding unit and a constant voltage source to discharge the photoelectric charge held by the second charge holding unit to the constant voltage source; and
a fourth transistor arranged on a wiring connecting the second transistor and the signal line to switch the connection between the second transistor and the signal line.

(32)
The solid-state imaging device according to any one of (21) to (31), further comprising a fifth transistor arranged on a wiring connecting the first charge holding unit and the constant voltage source to discharge the photoelectric charge held by the first charge holding unit to the constant voltage source.

(33)
The solid-state imaging device according to any one of (21) to (32), wherein the photoelectric conversion unit includes any one of indium gallium arsenide (InGaAs), indium arsenide antimonide (InAsSb), indium arsenide (InAs), indium antimonide (InSb), mercury cadmium tellurium (HgCdTe), germanium (Ge), a quantum dot, or an organic compound.

(34)
The solid-state imaging device according to any one of (21) to (33), wherein an electrode connected to the photoelectric conversion unit and an electrode connected to the first charge holding unit are directly bonded and electrically conductive.

(35)
The solid-state imaging device according to any one of (21) to (34), wherein a terminal connected to the photoelectric conversion unit and a terminal extending from the first charge holding unit are connected by a bump electrode and electrically conductive.

(36)
The solid-state imaging device according to any one of (21) to (32), wherein the photoelectric conversion unit has a p-type impurity region connected to the first charge holding unit.

(37)
An electronic device comprising:
a pixel array unit in which a plurality of pixels are arranged in row and column directions;
a drive circuit configured to drive pixels to be read out in the plurality of pixels;
a processing circuit configured to read out pixel signals from the pixels to be read out which are driven by the drive circuit; and
a control unit configured to control the drive circuit and the processing circuit,
wherein each of the plurality of pixels includes:
a photoelectric conversion unit configured to generate a photoelectric charge;
a first charge holding unit that includes a first capacitive element and holds the photoelectric charge generated by the photoelectric conversion unit;
a second charge holding unit that includes a second capacitive element and holds the photoelectric charge transferred from the first charge holding unit;
a first transistor arranged on a wiring connecting the first charge holding unit and the second charge holding unit to transfer the photoelectric charge held in the first charge holding unit to the second charge holding unit; and
a second transistor configured to cause a pixel signal of a voltage value corresponding to a charge amount of the photoelectric charge held in the second charge holding unit to appear on a signal line.

REFERENCE SIGNS LIST

1 Pixel circuit
10 Photoelectric conversion film
11 Reset transistor
12 Amplifier transistor
13 Select transistor
14 Transfer transistor
15 Discharge transistor
16, 17 Capacitor
100 Electronic device
101 Imaging lens
102 Image sensor
103 Processor
104 Storage unit
120 Pixel
121 Pixel array unit
122 Vertical drive circuit
123 Column processing circuit
124 Horizontal drive circuit
125 System control unit
126 Signal processing unit
127 Data storage unit

What is claimed is:

1. A light detecting device, comprising:
a photoelectric conversion region configured to generate a photoelectric charge;
a sense node, wherein the sense node is connected to the photoelectric conversion region, wherein the sense node includes a first capacitive element connected to a first voltage source, and wherein the sense node holds the photoelectric charge generated by the photoelectric conversion region;
a floating diffusion configured to hold the photoelectric charge transferred from the sense node, wherein the floating diffusion includes a second capacitive element connected to the first voltage source;
a transfer transistor between the sense node and the floating diffusion, wherein the transfer transistor is configured to selectively connect the sense node to the floating diffusion to transfer the photoelectric charge held in the sense node to the floating diffusion; and
an amplifier transistor between the floating diffusion and a signal line, wherein the amplifier transistor is configured to selectively cause a pixel signal of a voltage value corresponding to a charge amount of the photoelectric charge held in the floating diffusion to appear on the signal line, and wherein a first capacitance of the sense node approximates a second capacitance of the floating diffusion.

2. The light detecting device according to claim 1, wherein a capacitance of the first capacitive element is 10 fF (femtofarad) or more.

3. The light detecting device according to claim 1, wherein the first capacitive element is arranged near the transfer transistor, and the second capacitive element is arranged at a position other than a position where the transfer transistor, the amplifier transistor, and the first capacitive element are arranged.

4. The light detecting device according to claim 1, wherein a shielding member that shields the first capacitive element and the second capacitive element is arranged between the first capacitive element and the second capacitive element.

5. The light detecting device according to claim 1, wherein the first capacitive element includes any one of a metal oxide semiconductor (MOS) capacitor, a capacitor having a metal insulator metal (MIM) structure in which an insulator is sandwiched by metals, and a capacitor having a three-dimensional MIM structure.

6. The light detecting device according to claim 1, wherein the second capacitive element includes any one of a metal oxide semiconductor (MOS) capacitor, a capacitor having a metal insulator metal (MIM) structure in which an insulator is sandwiched by metals, and a capacitor having a three-dimensional MIM structure.

7. The light detecting device according to claim 1, further comprising:
a reset transistor arranged on a wiring connecting the floating diffusion and a constant voltage source to discharge the photoelectric charge held by the floating diffusion to the constant voltage source; and a select transistor arranged on a wiring connecting the amplifier transistor and the signal line to switch the connection between the amplifier transistor and the signal line.

8. The light detecting device according to claim 7, further comprising a discharge transistor arranged on a wiring connecting the sense node and the constant voltage source to discharge the photoelectric charge held by the sense node to the constant voltage source.

9. The light detecting device according to claim 1, wherein the photoelectric conversion region includes any one of indium gallium arsenide (InGaAs), indium arsenide antimonide (InAsSb), indium arsenide (InAs), indium antimonide (InSb), mercury cadmium tellurium (HgCdTe), germanium (Ge), a quantum dot, or an organic compound.

10. The light detecting device according to claim 1, wherein an electrode connected to the photoelectric conversion region and an electrode connected to the sense node are directly bonded and electrically conductive.

11. The light detecting device according to claim 1, wherein a terminal connected to the photoelectric conversion region and a terminal connected to the sense node are connected by a bump electrode and electrically conductive.

12. The light detecting device according to claim 1, wherein at least a portion of the first capacitive element and at least a portion of the second capacitive element are formed by a first wiring layer.

13. The light detecting device according to claim 12, wherein the first wiring layer is disposed between the photoelectric conversion region and the sense node.

14. The light detecting device according to claim 12, wherein the first voltage source is a low voltage source.

15. The light detecting device according to claim 1, wherein the photoelectric conversion region has a p-type impurity region connected to the sense node.

16. An electronic device, comprising:
a pixel array in which a plurality of pixels are arranged in row and column directions;
a drive circuit configured to drive pixels to be read out in the plurality of pixels; and
a processing circuit configured to read out pixel signals from the pixels to be read out which are driven by the drive circuit,
wherein each pixel of the plurality of pixels includes:
a photoelectric conversion region configured to generate a photoelectric charge;
a sense node, wherein the sense node is connected to the photoelectric conversion region, wherein the sense node includes a first capacitive element connected to a first voltage source, and wherein the sense node holds the photoelectric charge generated by the photoelectric conversion region;
a floating diffusion, wherein the floating diffusion includes a second capacitive element connected to the first voltage source, and wherein the floating diffusion holds the photoelectric charge transferred from the sense node;
a transfer transistor arranged between the sense node and the floating diffusion, wherein the transfer transistor is configured to selectively transfer the photoelectric charge held in the sense node to the floating diffusion; and
an amplifier transistor between the floating diffusion and a signal line, wherein the amplifier transistor is configured to selectively cause a pixel signal of a voltage value corresponding to a charge amount of the photoelectric charge held in the floating diffusion to appear on the signal line, and wherein a first capacitance of the sense node approximates a second capacitance of the floating diffusion.

17. A light detecting device, comprising:
a photoelectric conversion region configured to generate a photoelectric charge;
a sense node, wherein the sense node is connected to the photoelectric conversion region, wherein the sense node includes a first capacitive element connected to a first voltage source, and wherein the sense node holds the photoelectric charge generated by the photoelectric conversion region;
a floating diffusion configured to hold the photoelectric charge transferred from the sense node, wherein the floating diffusion includes a second capacitive element connected to the first voltage source;
a transfer transistor between the sense node and the floating diffusion, wherein the transfer transistor is configured to selectively connect the sense node to the floating diffusion to transfer the photoelectric charge held in the sense node to the floating diffusion; and
an amplifier transistor between the floating diffusion and a signal line, wherein the amplifier transistor is configured to selectively cause a pixel signal of a voltage value corresponding to a charge amount of the photoelectric charge held in the floating diffusion to appear on the signal line, and wherein a capacitance of the first capacitive element is smaller than a capacitance of the second capacitive element.

18. The light detecting device according to claim 17, wherein a first capacitance of the sense node approximates a second capacitance of the floating diffusion.

19. A light detecting device, comprising:
a photoelectric conversion region configured to generate a photoelectric charge;
a sense node, wherein the sense node is connected to the photoelectric conversion region, wherein the sense node includes a first capacitive element connected to a first voltage source, and wherein the sense node holds the photoelectric charge generated by the photoelectric conversion region;
a floating diffusion configured to hold the photoelectric charge transferred from the sense node, wherein the floating diffusion includes a second capacitive element connected to the first voltage source;
a transfer transistor between the sense node and the floating diffusion, wherein the transfer transistor is configured to selectively connect the sense node to the floating diffusion to transfer the photoelectric charge held in the sense node to the floating diffusion; and
an amplifier transistor between the floating diffusion and a signal line, wherein the amplifier transistor is configured to selectively cause a pixel signal of a voltage value corresponding to a charge amount of the photoelectric charge held in the floating diffusion to appear on the signal line, and wherein an occupied area of the first capacitive element is less than an occupied area of the second capacitive element.

* * * * *